(12) United States Patent
Sharma et al.

(10) Patent No.: US 10,192,789 B1
(45) Date of Patent: Jan. 29, 2019

(54) METHODS OF FABRICATING DUAL THRESHOLD VOLTAGE DEVICES

(71) Applicant: Spin Transfer Technologies, Fremont, CA (US)

(72) Inventors: Gian Sharma, Fremont, CA (US); Amitay Levi, Cupertino, CA (US); Kuk-Hwan Kim, San Jose, CA (US)

(73) Assignee: SPIN TRANSFER TECHNOLOGIES, Fremont, CA (US)

( * ) Notice: Subject to any disclaimer, the term of this patent is extended or adjusted under 35 U.S.C. 154(b) by 0 days.

(21) Appl. No.: 15/865,140

(22) Filed: Jan. 8, 2018

(51) Int. Cl.
*H01L 21/8234* (2006.01)
*H01L 21/3205* (2006.01)
*H01L 27/22* (2006.01)
*H01L 29/06* (2006.01)
*H01L 29/40* (2006.01)
*H01L 29/66* (2006.01)
*H01L 29/786* (2006.01)
(Continued)

(52) U.S. Cl.
CPC ........... *H01L 21/823487* (2013.01); *H01L 21/32053* (2013.01); *H01L 27/228* (2013.01); *H01L 29/0676* (2013.01); *H01L 29/401* (2013.01); *H01L 29/66666* (2013.01); *H01L 29/7827* (2013.01); *H01L 29/78642* (2013.01); *H01L 43/08* (2013.01); *H01L 43/12* (2013.01)

(58) Field of Classification Search
CPC .......... H01L 29/7827; H01L 29/66666; H01L 29/0676; H01L 29/78642; H01L 29/78618; H01L 29/78648; H01L 21/823487; H01L 21/32053; H01L 21/28052; H01L 21/823475; H01L 21/823425; H01L 21/823418; H01L 21/823885
See application file for complete search history.

(56) References Cited

U.S. PATENT DOCUMENTS 4,910,709 A 3/1990 Dhong et al.
5,656,842 A * 8/1997 Iwamatsu ............. H01L 27/088
257/329
(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, 3 pgs.
(Continued)

*Primary Examiner* — Marvin Payen
*Assistant Examiner* — Jeremy Joy
(74) *Attorney, Agent, or Firm* — Morgan, Lewis & Bockius LLP

(57) ABSTRACT

A device having two transistors with dual thresholds, and a method of fabricating the device, including fabricating a silicide source, a conductive layer, and contacts to a plurality of layers of the device, is provided. The device has a core and a plurality of layers that surround the core in succession, including a first layer, a second layer, a third layer, and a fourth layer. The device further comprises a first input terminal coupled to the core, the first input terminal being configured to receive a first voltage and a second input terminal coupled to the fourth layer, the second input terminal being configured to receive a second voltage. The device comprises a common source terminal coupled to the core and the fourth layer. A memory device, such as an MTJ, may be coupled to the device.

25 Claims, 33 Drawing Sheets

(51) Int. Cl.
*H01L 29/78* (2006.01)
*H01L 43/08* (2006.01)
*H01L 43/10* (2006.01)
*H01L 43/12* (2006.01)

(56) References Cited

U.S. PATENT DOCUMENTS

| | | | |
|---|---|---|---|
| 5,717,373 | A | 2/1998 | Vachris |
| 7,936,597 | B2 | 5/2011 | Clinton et al. |
| 8,008,706 | B2 | 8/2011 | Choi et al. |
| 8,107,280 | B2 | 1/2012 | Yoon et al. |
| 8,179,711 | B2 | 5/2012 | Kim et al. |
| 8,353,568 | B2 | 1/2013 | Lee |
| 9,142,277 | B2 | 9/2015 | Kim et al. |
| 9,208,878 | B2 | 12/2015 | Iyer et al. |
| 9,337,415 | B1 | 5/2016 | Oh et al. |
| 9,502,133 | B2 | 11/2016 | Ueda et al. |
| 9,608,043 | B2 | 3/2017 | Shimabukuro et al. |
| 9,734,882 | B2 | 8/2017 | Toh et al. |
| 9,773,913 | B1 * | 9/2017 | Balakrishnan .... H01L 29/78618 |
| 2005/0073878 | A1 | 4/2005 | Lin et al. |
| 2005/0184348 | A1 * | 8/2005 | Youn ............... H01L 21/823487 257/401 |
| 2006/0152969 | A1 | 7/2006 | Trouilloud |
| 2007/0201265 | A1 | 8/2007 | Ranjan et al. |
| 2009/0032849 | A1 * | 2/2009 | Higashino ......... H01L 29/66666 257/262 |
| 2010/0052029 | A1 * | 3/2010 | Huang .............. H01L 27/10876 257/309 |
| 2010/0102290 | A1 | 4/2010 | Lu et al. |
| 2010/0187601 | A1 * | 7/2010 | Masuoka .............. H01L 29/456 257/329 |
| 2011/0062515 | A1 * | 3/2011 | Masuoka ........ H01L 21/823828 257/334 |
| 2012/0217468 | A1 * | 8/2012 | Tekleab ................. B82Y 10/00 257/9 |
| 2012/0313742 | A1 | 12/2012 | Kurs et al. |
| 2013/0200467 | A1 | 8/2013 | Edge et al. |
| 2014/0008606 | A1 * | 1/2014 | Hussain .............. H01L 29/0676 257/9 |
| 2014/0050019 | A1 | 2/2014 | Lee et al. |
| 2014/0170821 | A1 * | 6/2014 | Nyhus ............... H01L 29/66666 438/268 |
| 2015/0138873 | A1 | 5/2015 | Lu et al. |
| 2015/0279904 | A1 | 10/2015 | Pinarbasi et al. |
| 2016/0079361 | A1 * | 3/2016 | Ching ................. H01L 29/0676 257/9 |
| 2016/0225818 | A1 | 8/2016 | Toh et al. |
| 2016/0372656 | A1 | 12/2016 | Pinarbasi et al. |
| 2017/0005106 | A1 * | 1/2017 | Zhang ............... H01L 29/42392 |
| 2017/0317070 | A1 | 11/2017 | Salcedo et al. |
| 2018/0075895 | A1 | 3/2018 | Kishi et al. |
| 2018/0096896 | A1 * | 4/2018 | Zhu ..................... H01L 21/8221 |

OTHER PUBLICATIONS

Vincent et al., "Spin-Transfer Torque Magnetic Memory as a Stochastic Memristive Synapse for Neuromorphic Systems," IEEE Transactions on Biomedical Circuits and Systems, vol. 9, No. 2, Apr. 2015, 9 pgs.
Yuen et al., "A 2-Bit MONOS Nonvolatile Memory Cell Based on Asymmetric Double Gate MOSFET Structure," IEEE Electron Device Letters, vol. 24, No. 8, Aug. 2003, 3 pgs.
Kim, Office Action dated Sep. 17, 2018, U.S. Appl. No. 15/865,125, 10 pgs.
Sharma, Notice of Allowance dated Sep. 13, 2018, U.S. Appl. No. 15/865,138, 17 pgs.
Bhatti et al., "Spintronics based random access memory: a review," Materials Today, vol. 20, No. 9, 530-548, Nov. 2017, from http://dx.doi.org/10.1016/j.mattod.2017.07.007, 19 pgs.
Chen et al., "On-Chip Caches Built on Multilevel Spin-Transfer Torque RAM Cells and Its Optimizations," ACMJournal on Emerging Technologies in Computing Systems, vol. 9, No. 2, Article 16, May 2013, 22 pgs.
Chen et al., "Processor Caches Built Using Multi-Level Spin-Transfer Torque RAM Cells," Jun. 2011 © 2011 IEEE, 6 pgs.
Dyakonov, M. I., "Spin Hall Effect," arXiv:1210.3200v1 (2010), from https://arxiv.org/ftp/arxiv/papers/1210/1210.3200.pdf, 12 pgs.
Jiang et al., "Constructing Large and Fast Multi-Level Cell STT-RAM based Cache for Embedded Processors," DAC 20125, Jun. 3-7, 2012, San Francisco, California, 6 pgs.
Li Gao, "Spin Polarized Current Phenomena in Magnetic Tunnel Junctions," Ph.D. Dissertation, Stanford University, Sep. 2009, 126 pgs.
Li et al., A New Self-reference Sensing Scheme for TLC MRAM, Sep. 2015 © 2015 IEEE, 4 pgs.
Sbiaa et al., "Materials with perpendicular magnetic anisotropy for magnetic random access memory," Phys. Status Solidi RRL 5, No. 12, 413-419 (2011) / DOI: 10.1002/pssr.201105420, 7 pgs.
Van den Brink et al., "Spin-Hall-assisted magnetic random access memory," Applied Physics Letters, 104, 012403 (2014), 4 pgs.
Wang et al., "Spintronic materials and devices based on antiferromagnetic metals," Progress in Natural Science: Materials International, Oct. 23, 2016, 27 (2017) 208-216, 9 pgs.
Zhang et al., "MLC STT-RAM Design Considering Probabilistic and Asymmetric MTJ Switching," Mar. 2013 © 2013 IEEE, 4 pgs.
Zhang et al., Multi-level Cell STT-RAM: Is it Realistic or Just a Dream?, IEEE/ACM International Conference on Computer-Aided Design, Nov. 5-8, 2012, San Jose, California, 8 pgs.
Bozdag, Office Action dated Jul. 18, 2018, U.S. Appl. No. 15/859,259, 15 pgs.

* cited by examiner (Parallel Configuration)

(Anti-Parallel Configuration)

1202
1106

1204

1206

(i)

(ii)

METHODS OF FABRICATING DUAL THRESHOLD VOLTAGE DEVICES

RELATED APPLICATIONS

This application is related to U.S. Utility patent application Ser. No. 15/865,125, entitled "Adjustable Current Selectors," filed Jan. 8, 2018," U.S. Utility patent application Ser. No. 15/865,138, entitled "Dual Threshold Voltage Devices with Stacked Gates," filed Jan. 8, 2018," U.S. Utility patent application Ser. No. 15/865,135, entitled "Dual Threshold Voltage Devices," filed Jan. 8, 2018," U.S. Utility patent application Ser. No. 15/865,132, entitled "Methods of Fabricating Dual Threshold Voltage Devices with Stacked Gates," filed Jan. 8, 2018," U.S. Utility patent application Ser. No. 15/865,123, entitled "Methods of Fabricating Contacts for Cylindrical Devices," filed Jan. 8, 2018," U.S. Utility patent application Ser. No. 15/865,144, entitled "Dual Gate Memory Devices," filed Jan. 8, 2018," each of which is incorporated by reference herein in its entirety.

TECHNICAL FIELD

This relates generally to the field of memory applications and voltage devices, including but not limited to dual threshold voltage devices.

BACKGROUND

The field of memory applications is becoming more challenging as the performance requirements for memory-based devices increase. Because of many useful properties of dual threshold voltage devices (e.g., adjustability, density, and drivability), memory systems comprising dual threshold voltage devices have superior performance over conventional memory systems.

SUMMARY

There is a need for systems and/or devices with more efficient, accurate, and effective methods for fabricating and/or operating memory systems. Such systems, devices, and methods optionally complement or replace conventional systems, devices, and methods for fabricating and/or operating memory systems.

The present disclosure describes a dual threshold voltage device, also sometimes called a dual gate device. For example, a device is provided, the device comprising a core, a plurality of layers that surround the core in succession, including a first layer, a second layer, a third layer, and a fourth layer. The core, the first layer, and the second layer correspond to a first transistor. In some embodiments, the core is the gate of the first transistor, the first layer is the gate dielectric of the first transistor, and the second layer serves as a channel of the first transistor as well as a channel of the second transistor. The second layer, the third layer, and the fourth layer correspond to a second transistor. In some embodiments, the third layer is a gate dielectric for the second transistor and the fourth layer is a gate of the second transistor. It is important to note that the second layer is a common channel for the first and second transistors. The device further comprises a first input terminal coupled to the core, the first input terminal being configured to receive a first voltage and a second input terminal coupled to the fourth layer, the second input terminal being configured to receive a second voltage. The device further comprises a common source terminal coupled to the core and the fourth layer. In other words, the device further comprises a common source terminal for both transistors which is a lower portion of the common cylindrical channel. The upper portion of the cylindrical channel serves as a common drain for the first and second transistors. In some implementations, a memory device, such as an MTJ is coupled to the channel drain of the device (e.g., the dual Vt transistors). Thus, in some implementations, a device for easily programming an MTJ, the device having two threshold voltages, is provided. An exemplary device is provided in FIG. 5.

In one aspect, some implementations include a method of fabricating an annular device (e.g., an annular dual threshold voltage device). The method comprises providing a cylindrical device having a conductive core corresponding to a first transistor and a plurality of annular layers surrounding the core, including a first dielectric layer, a second layer, a third dielectric layer, and a fourth conductive layer corresponding to a second transistor and creating a silicide source, wherein the silicide source is coupled to the conductive core corresponding to the first transistor and the fourth conductive layer corresponding to the second transistor. The method of creating the silicide source includes coating a first oxide substrate with an organic polymerizing layer (OPL) to create an OPL plane, wherein the OPL plane surrounds a horizontal cross section of the cylindrical device and depositing low-temperature silicon oxide (LTO) on the OPL to create an LTO layer, wherein the LTO layer surrounds a horizontal cross section of the cylindrical device. The method of creating the silicide source further includes coating the LTO layer with a bottom antireflective coating (BARC) layer and a photoresistive (PR) layer, applying a layer of silicide to create the silicide source and creating a mask with the PR layer, wherein the mask covers the second layer of the cylindrical device. The method further includes dry etching the BARC layer, the LTO layer and the OPL until the oxide substrate is exposed and then etching horizontally the LTO layer and oxide to expose a layer of silicon on a horizontal cross section of the cylindrical device to create an annular area. The method further includes Ion Implanting a source dopant and performing a first rapid thermal annealing (RTA) on the annular area to reduce its electrical resistance and then depositing a siliciding metal on the annular area to create the silicide source and performing a second RTA to reduce its electrical resistance.

In another aspect, some implementations include a method for fabricating an annular device, including an annular polycide layer. The method comprises forming a cylindrical device having a conductive core corresponding to a first transistor and a plurality of annular layers surrounding the core, including a first dielectric layer, a second layer, a third dielectric layer, and a fourth conductive layer corresponding to a second transistor. The method further comprises coating a spin-on glass (SOG) layer on a first plane and the cylindrical device to create a sloped ring around the bottom of the cylindrical device, wherein the cylindrical device is vertically disposed in the first plane and the SOG surrounds the cylindrical device. The method further comprises etching the SOG layer from around and inside the cylindrical device to a desired depth and depositing dielectric materials to form the third dielectric layer. The method further includes depositing doped chemically vaporized polysilicon on the first plane, a horizontal cross section of the cylindrical device, a top of the cylindrical device, and the sloped ring around the cylindrical device (e.g., using chemically vaporized deposition). The method further includes etching, using a reactive-ion etch (RIE), the polysilicon on the top of the cylindrical device and on the sloped ring and depositing a siliciding metal and performing rapid thermal anneal (RTA) to create the fourth conductive layer of reduced electrical resistivity.

In another aspect, some implementations include a method for fabricating an annular device, including creating a contact between a required node of the device to other metal connections. Some aspects of the method include providing a cylindrical device having a conductive core corresponding to a first transistor and a plurality of annular layers surrounding the core, including a first dielectric layer, a second layer, a third dielectric layer, and a fourth conductive layer corresponding to a second transistor, wherein the fourth conductive layer is an outermost layer of the cylindrical device. Some methods include converting the fourth conductive layer of the CVD polysilicon to a low resistivity silicide a gate of the second transistor. This may include depositing a first low-temperature oxide (LTO) layer to create a first LTO plane and spin coating a spin-on glass (SOG) layer in the first LTO plane, wherein the cylindrical device is vertically disposed in the first LTO plane. The method for making a contact to the conductive layer for the gate of the second transistor includes etching the SOG layer to a first thickness and spin coating an organic compound to a first height to create an organic planarizing layer (OPL), wherein the OPL surrounds a horizontal cross section of the cylindrical device. The method further includes depositing a second LTO layer onto the OPL, wherein the second LTO layer surrounds a horizontal cross section of the cylindrical device, and coating the second LTO layer with a bottom anti-reflective coating (BARC) layer. The method further includes coating the BARC layer with a photoresist layer, wherein the BARC layer and the photoresist layer surround a horizontal cross section of the cylindrical device and creating a mask with the photoresist layer. The method further includes dry etching the BARC layer and the second LTO layer using a fluorine-based chemistry through the BARC layer and the second LTO layer into the OPL, wherein the dry etching areas is defined by the mask layout of the photoresist pattern layer. The method further includes etching the OPL in oxygen plasma until the SOG layer is exposed to create a trench and depositing tantalum nitride in the trench to create a contact from the silicided polysilicon of the gate to the metal lines needed for the memory device or connection to the logic devices.

In another aspect, some implementations include a method for fabricating an annular device, including creating a contact between a core of a device and any other metal line for connection to a given core. The method comprises providing a cylindrical device having a conductive core corresponding to a first transistor and a plurality of annular layers surrounding the core, including a first dielectric layer, a second layer, a third dielectric layer, and a fourth conductive layer corresponding to a second transistor. The method further comprises coupling (or providing access to couple) the conductive core of the cylindrical device to other metal nodes. This includes depositing, by chemical vapor deposition (CVD), a first silicon nitride (SiN) layer to create a first SiN plane. The method further includes depositing a spin-on glass (SOG) layer and a low temperature oxide (LTO) layer and performing a metal gate contact mask. The method further includes etching, using an ion beam trench etch, to create a trench through the plurality of annular layers surrounding the core and depositing a second SiN layer in the trench and on sides of the trench. The method further includes removing the deposited first SiN layer from the core by a first chemical mechanical polishing (CMP) and depositing a metal gate contact and metal lines to create a contact from the conductive core to outer metal lines.

Thus, devices and systems are provided with methods for fabricating and operating dual threshold (e.g., dual gate) devices, thereby increasing the effectiveness, efficiency, and user satisfaction with such systems and devices.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 9-15 illustrate a process for forming a silicide source in accordance with some implementations. FIG. 14 illustrates a schematic view of both an N-device and a P-device in accordance with some implementations.

FIGS. 16-18 illustrate processes for forming an annular transistor in accordance with some implementations. FIG. 18 illustrates a post-etching state of the annular device in accordance with some implementations.

FIGS. 21-23 illustrate a representative process for creating a contact for a transistor located in the center of an annular device in accordance with some implementations.

Like reference numerals refer to corresponding parts throughout the several views of the drawings.

DETAILED DESCRIPTION

Figure 1A:
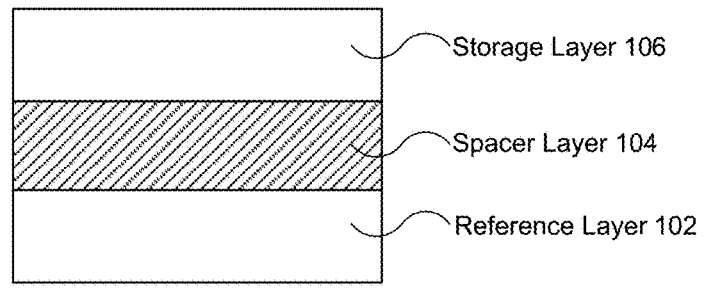
FIG. 1A shows a schematic diagram of a representative magnetic tunnel junction (MTJ) structure in accordance with some implementations.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

A device, and a method of fabricating the device, having dual threshold voltages is provided. The device has a core, a plurality of layers that surround the core in succession, including a first layer, a second layer, a third layer, and a fourth layer. The core, the first layer, and the second layer correspond to a first transistor. The second layer, the third layer, and the fourth layer correspond to a second transistor. The second layer is a common channel for the first and second transistors. The device further comprises a first input terminal coupled to the core, the first input terminal being configured to receive a first voltage and a second input terminal coupled to the fourth layer, the second input terminal being configured to receive a second voltage. The device further comprises a common source terminal coupled to the core and the fourth layer (but not physically or electrically shorting). In some implementations, a memory device, such as an MTJ is coupled to the drain side of the channel of the device. Thus, in some implementations, a device and a method of fabrication of the device that can be used to easily and efficiently program an MTJ is provided.

In some implementations, dual threshold voltage, dual transistor CMOS devices are provided. In some implementations, cylindrical pillars are etched out of silicon for CMOS devices (e.g., <100> silicon). In some implementations, the channels are annular vertical cylinders etched into silicon. In some implementations, the source comprises bottom silicided areas of the annular cylinder of silicon and the drain is the top part of the channel. In some implementations, the innermost cylinder makes the first transistor (e.g., Gate 1) electrode with a first threshold voltage (e.g., Vt1). In some implementations, the outer wrap around the poly cylinder makes the second transistor (e.g., Gate 2) with a second threshold voltage (e.g., Vt2). In some implementations, the first threshold voltage and the second threshold voltage of the N and/or P type devices (e.g., transistors) can be individually tailored by proper choices of: the dopant of the cylindrical pillar, the thickness of the gates' dielectrics, the dielectric constant of their gates' materials, and the/or the work functions of the gate electrodes. In some implementations, the thicker the cylindrical pillar means the greater the drive currents will be. In some implementations, the combined drive current is an order of magnitude more than a surface device with a given photolithographic step (F, minimum feature size). In some implementations, the shallower the pillar, the faster will be the speed of the vertical channel transistors. In some implementations, having a dual threshold voltage device saves real estate (e.g., space) in the layout in analog CMOS circuits, digital, and/or memory.

Magnetic Memory Devices

Magnetoresistive random access memory (MRAM) is a non-volatile memory technology that stores data through magnetic storage elements. MRAM devices store information by changing the orientation of the magnetization of a storage layer. For example, based on whether the storage layer is in a parallel or anti-parallel alignment relative to a reference layer, either a "1" or a "0" can be stored in each MRAM cell.

The present disclosure describes various implementations of MRAM systems and devices. As discussed in greater detail below, MRAM stores data through magnetic storage elements. These elements typically include two ferromagnetic films or layers that can hold a magnetic field and are separated by a non-magnetic material. In general, one of the layers has its magnetization pinned (e.g., a "reference layer"), meaning that this layer requires a large magnetic field or spin-polarized current to change the orientation of its magnetization. The second layer is typically referred to as the storage, or free, layer and its magnetization direction can be changed by a smaller magnetic field or spin-polarized current relative to the reference layer.

Due to the spin-polarized electron tunneling effect, the electrical resistance of the cell changes due to the orientation of the magnetization of the two layers. A memory cell's resistance will be different for the parallel and anti-parallel states and thus the cell's resistance can be used to distinguish between a "1" and a "0". One important feature of MRAM devices is that they are non-volatile memory devices, since they maintain the information even when the power is off. In particular, the layers can be sub-micron in lateral size and the magnetization direction can still be stable over time and with respect to thermal fluctuations.

FIG. 1A is schematic diagram of a magnetic tunnel junction (MTJ) structure 100 (e.g., for use in an MRAM device) in accordance with some implementations. In accordance with some implementations, the MTJ structure 100 is composed of a first ferromagnetic layer (reference layer 102), a second ferromagnetic layer (storage layer 106), and a non-magnetic layer (spacer layer 104). The reference layer 102 is also sometimes referred to as a pinned or fixed layer. The storage layer 106 is also sometimes referred to as a free layer. The spacer layer 104 is also sometimes referred to as a barrier layer (or a non-magnetic spacer layer). In some implementations, the spacer layer 104 comprises an electrically-insulating material such as magnesium oxide (MgO) or $MgAl_2O_4$.

In some implementations, the reference layer 102 and the storage layer 106 are composed of the same ferromagnetic material. In some implementations, the reference layer 102 and the storage layer 106 are composed of different ferromagnetic materials. In some implementations, the reference layer 102 is composed of a ferromagnetic material that has a higher coercivity and/or thermal stability than the storage layer 106. In some implementations, the reference layer 102 and the storage layer 106 are composed of different ferromagnetic materials with the same or similar thicknesses (e.g., within 10%, 5%, or 1% of one another). In some implementations, the thickness of the reference layer 102 is different from that of the storage layer 106 (e.g., the reference layer 102 is thicker than the storage layer 106). In some implementations, the thickness of the spacer layer 104 is on the order of a few atomic layers. In some implementations, the thickness of the spacer layer 104 is on the order of a few nanometers (nm). In some implementations, thicknesses of the reference layer 102, the spacer layer 104, and the storage layer 106 are uniform. In some implementations, thicknesses of the reference layer 102, the spacer layer 104, and the storage layer 106 are not uniform (e.g., a first portion of the spacer layer 104 is thinner relative to a second portion of the spacer layer 104).

In some implementations, the reference layer 102 and/or the storage layer 106 is composed of two or more ferromagnetic layers are separated from one another with spacer layers. In some implementations, each of these ferromagnetic layers is composed of identical, or varying, thickness(es) and/or material(s). In some implementations, the spacer layers are composed of identical, or varying, thickness(es) and/or material(s) with respect to one another.

Figure 1B:
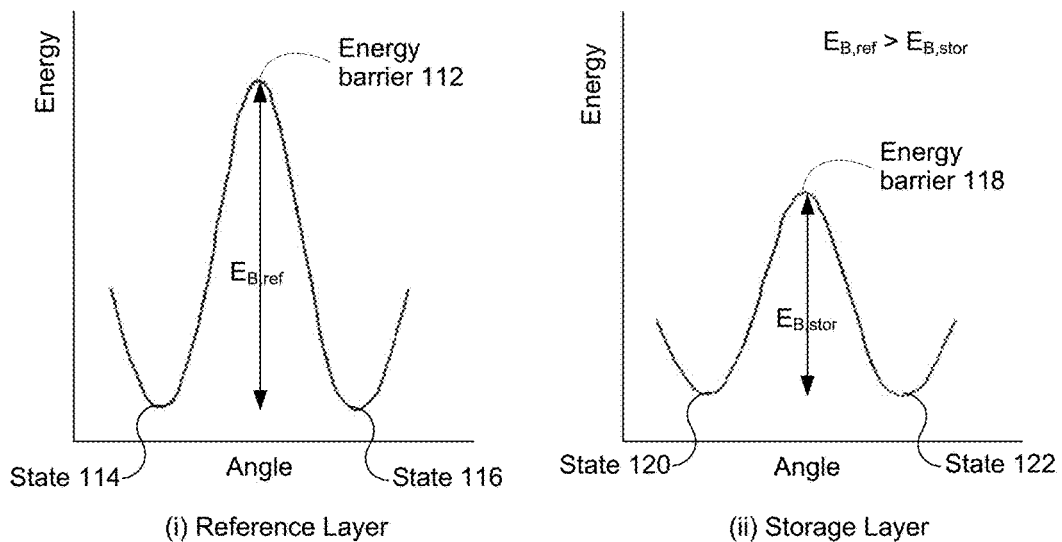
FIG. 1B shows representative energy barriers of the reference and storage layers of the MTJ of FIG. 1A in accordance with some implementations.
Figure 10A:
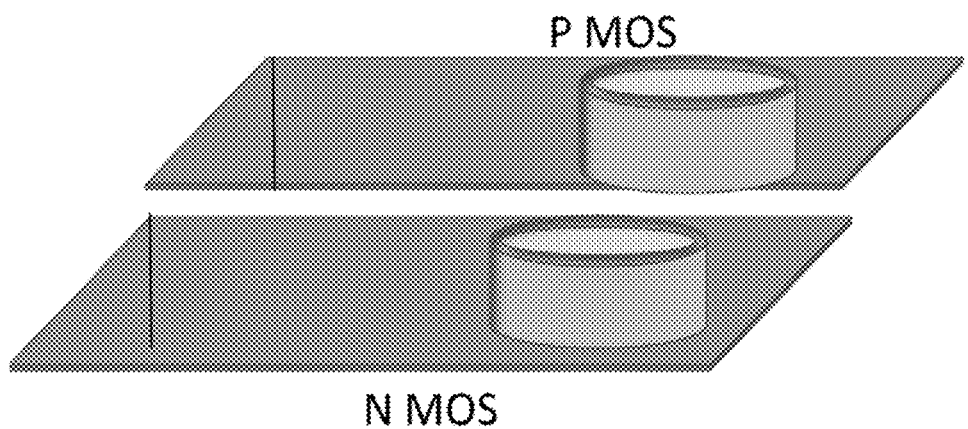
FIGS. 10A-10B illustrate a doping process in accordance with some implementations.
Figure 10B:
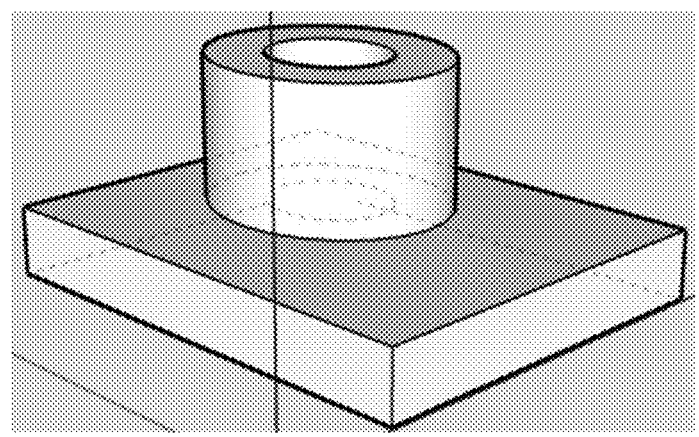

Magnetic anisotropy refers to the directional dependence of a material's magnetic properties. The magnetic moment of magnetically anisotropic materials will tend to align with an "easy axis," which is the energetically favorable direction of spontaneous magnetization. In some implementations and instances, the two opposite directions along an easy axis are equivalent, and the direction of magnetization can be along either of them (and in some cases, about them). For example, in accordance with some implementations, FIG. 1B shows low energy states 114 and 116 corresponding to opposite directions along an easy axis (additional examples are shown in FIGS. 10A-10B with reference to a cylindrical three-dimensional MTJ structure).

In some implementations, the MTJ structure 100 is an in-plane MTJ. In this instance, the magnetic moments of the reference layer 102 and the storage layer 106, and correspondingly their magnetization direction, are oriented in the plane of the ferromagnetic films of the reference layer 102 and the storage layer 106.

In some implementations, the MTJ structure 100 is a perpendicular (or out-of-plane) MTJ. In this instance, the magnetic moments of the reference layer 102 and the storage layer 106, and correspondingly their magnetization direction, are oriented perpendicular and out-of-plane to the ferromagnetic films of the reference layer 102 and the storage layer 106.

In some implementations, the MTJ structure 100 has preferred directions of magnetization at arbitrary angles with respect to the magnetic films of the reference layer 102 and the storage layer 106.

In accordance with some implementations, an MRAM device provides at least two states such that they can be assigned to digital signals "0" and "1," respectively. One storage principle of an MRAM is based on the energy barrier required to switch the magnetization of a single-domain magnet (e.g., switch the magnetization of the storage layer 106) from one direction to the other.

FIG. 1B shows representative energy barriers of the reference layer 102 and the storage layer 106 of the MTJ 100 in accordance with some implementations. In accordance with some implementations, the energy barrier refers to the amount of energy the magnetic material must overcome in order to switch from one magnetization direction to its opposite (e.g., from the state 114 to the state 116). In an MRAM device, the magnetization direction of the reference layer 102 is generally considered fixed, while the magnetization direction of the storage layer 106 is varied to store the "0" and "1" states. Accordingly, the reference layer 102 is composed of materials such that an energy barrier 112 ($E_{B, ref}$) of the reference layer 102 is larger than the energy barrier 118 ($E_{B, stor}$) of the storage layer 106. In particular, FIG. 1B shows low energy states 114 and 116 for the reference layer 102 separated by the energy barrier 112, and shows low energy states 120 and 122 for the storage layer 106 separated by the energy barrier 118. In some implementations, the storage layer 106 is designed with materials that have a magnetic anisotropy that is high enough to store the magnetization over certain time duration (for e.g., 1 week, 1 month, 1 year, or 10 years).

For an MRAM device with the MTJ structure 100, the resistance states of the MRAM devices are different when the magnetization directions of the reference layer 102 and the storage layer 106 are aligned in a parallel (low resistance state) configuration or in an anti-parallel (high resistance state) configuration, as will be discussed with respect to FIGS. 2A and 2B.

Figure 2A:
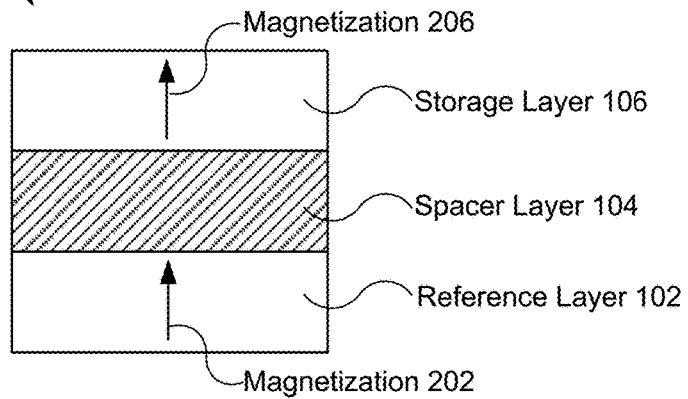
FIGS. 2A-2B illustrate magnetization orientations in a representative perpendicular magnetic tunnel junction (pMTJ) structure in accordance with some implementations.
Figure 2B:
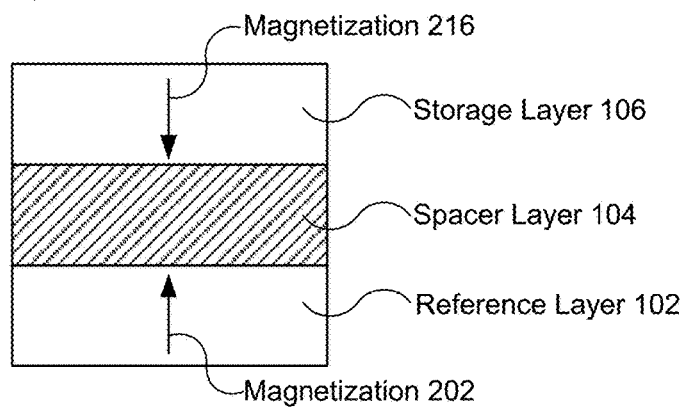

FIGS. 2A-2B illustrate magnetization orientations in a perpendicular magnetic tunnel junction (pMTJ) structure 200 in accordance with some implementations. In some implementations, the pMTJ structure 200 is the same as the MTJ structure 100 presented in FIG. 1A, comprising: the reference layer 102, the spacer layer 104, and the storage layer 106. In some implementations, the pMTJ structure 200 forms part of a MRAM device.

For the pMTJ structure 200 illustrated in FIGS. 2A and 2B, the fixed magnetization direction 202 for the reference layer 102 is chosen to be in an upward direction and is represented by an up arrow. In some implementations (not shown), the fixed magnetization direction of the reference layer 102 in the pMTJ structure 200 is in a downward direction.

FIG. 2A illustrates the magnetization directions of the storage and reference layers in a parallel configuration. In the parallel configuration, the magnetization direction 206 of the storage layer 106 is the same as the magnetization direction 202 of the reference layer 102. In this example, the magnetization direction 202 of the reference layer 102 and the magnetization direction 206 of the storage layer 106 are both in the upward direction. The magnetization direction of the storage layer 106 relative to the fixed layer 102 changes the electrical resistance of the pMTJ structure 200. In accordance with some implementations, the electrical resistance of the pMTJ structure 200 is low when the magnetization direction of the storage layer 106 is the same as the magnetization direction 202 of the reference layer 102. Accordingly, the parallel configuration is also sometimes referred to as a "low (electrical) resistance" state.

FIG. 2B illustrates the magnetization directions of the storage and reference layers in an anti-parallel configuration. In the anti-parallel configuration, the magnetization direction 216 of the storage layer 106 is opposite to the "fixed" magnetization direction 202 of the reference layer 102. In accordance with some implementations, the electrical resistance of the pMTJ structure 200 is high when the magnetization direction 216 of the storage layer 106 is the opposite of the magnetization direction 202 of the reference layer 102. Accordingly, the anti-parallel configuration is sometimes also referred to as a "high (electrical) resistance" state.

Thus, by changing the magnetization direction of the storage layer 106 relative to that of the reference layer 102, the resistance states of the pMTJ structure 200 can be varied between low resistance to high resistance, enabling digital signals corresponding to bits of "0" and "1" to be stored and read. Conventionally, the parallel configuration (low resistance state) corresponds to a bit "0," whereas the anti-parallel configuration (high resistance state) corresponds to a bit "1".

Although FIGS. 2A-2B show parallel and anti-parallel configurations with the pMTJ structure 200, in some implementations, an in-plane MTJ structure, or an MTJ structure with an arbitrary preferred angle, is used instead.

FIGS. 3A-3D illustrate representative processes for switching the pMTJ 200 between the parallel and anti-parallel configurations in accordance with some implementations. In accordance with some implementations, spin-transfer torque (STT) is used to modify the magnetization directions of an MTJ. STT is an effect in which the magnetization direction of a ferromagnetic layer in an MTJ is modified by injecting a spin-polarized current into the magnetic element.

In general, electrons possess a spin, a quantized number of angular momentum intrinsic to the electron. An electrical current is generally unpolarized, e.g., it consists of 50% spin up and 50% spin down electrons. When a current is applied though a ferromagnetic layer, the electrons are polarized with spin orientation corresponding to the magnetization direction of the ferromagnetic layer, thus producing a spin-polarized current (or spin-polarized electrons).

As described earlier, the magnetization direction of the reference layer 102 is "fixed" in an MTJ (e.g., the applied currents are insufficient to change the magnetization state of the reference layer). Therefore, spin-polarized electrons may be used to switch the magnetization direction of the storage layer 106 in the MTJ (e.g., switch between parallel and anti-parallel configurations).

As will be explained in further detail, when spin-polarized electrons travel to the magnetic region of the storage layer 106 in the MTJ, the electrons will transfer a portion of their spin-angular momentum to the storage layer 106, to produce a torque on the magnetization of the storage layer 106. When sufficient torque is applied, the magnetization of the storage layer 106 switches, which, in effect, writes either a "1" or a "0" based on whether the storage layer 106 is in the parallel or anti-parallel configuration relative to the reference layer.

Figure 3A:
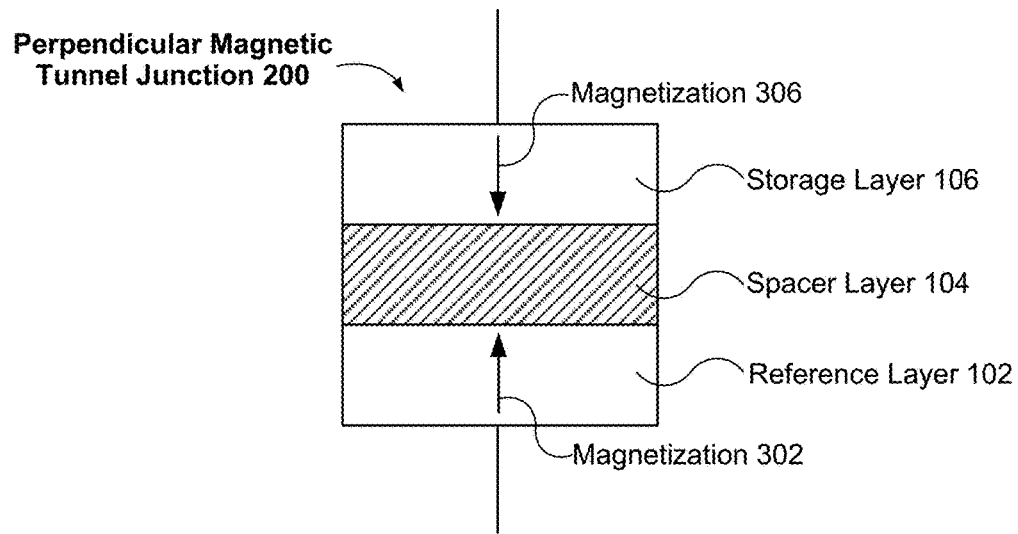
FIGS. 3A-3D illustrate representative processes for switching the pMTJ of FIGS. 2A-2B between the parallel and anti-parallel configurations in accordance with some implementations.
Figure 3B:
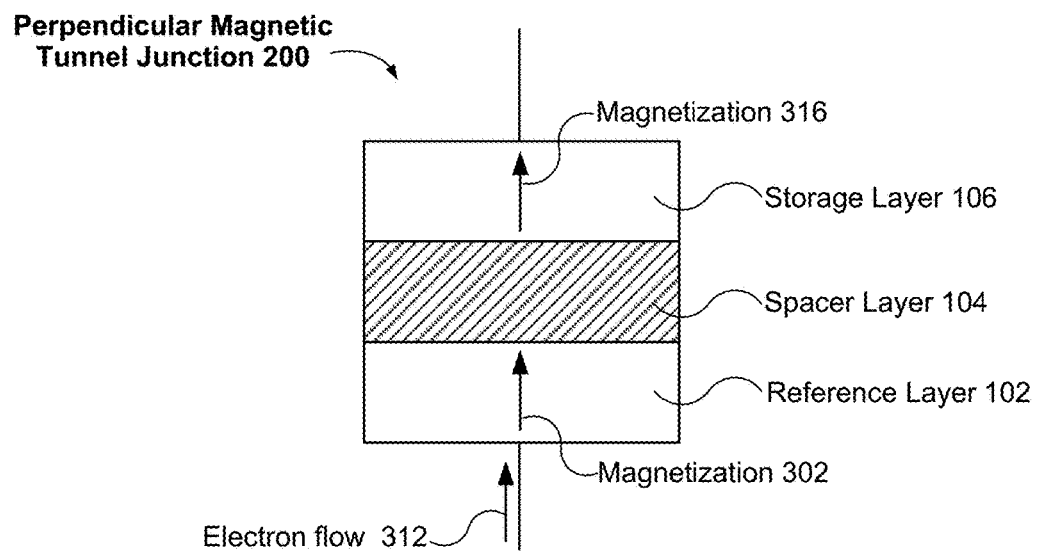

FIGS. 3A-3B illustrate the process of switching from the anti-parallel configuration to the parallel configuration. In FIG. 3A, the pMTJ structure 200 is in the anti-parallel configuration, e.g., the magnetization direction 302 of the reference layer 102 is opposite to the magnetization direction 306 of the storage layer 106.

FIG. 3B shows application of a current such that electrons flow through the pMTJ 200 in accordance with electron flow 312. The electrons are directed through the reference layer 102 which has been magnetized with the magnetization direction 302. As the electrons flow through the reference layer 102, they are polarized (at least in part) by the reference layer 102 and have spin orientation corresponding to the magnetization direction 302 of the reference layer 102. The majority of the spin-polarized electrons tunnel through the spacer layer 104 without losing their polarization and subsequently exert torque on the orientation of magnetization of the storage layer 106. When a sufficiently large current is applied (e.g., a sufficient number of polarized electrons flow into the storage layer 106), the spin torque flips, or switches, the magnetization direction of the storage layer 106 from the magnetization direction 306 in FIG. 3A to the magnetization direction 316 in FIG. 3B.

Thus, as shown in FIG. 3B, the magnetization direction 316 of the storage layer 106 is in the same (upward) direction as the magnetization direction 302 of the reference layer 102. Accordingly, the pMTJ structure 200 in FIG. 3B is in the parallel (low resistance state) configuration. In some implementations and instances, electrons that possess spins in the minority (opposite) direction are reflected at the barrier interfaces and exert torque on the magnetization direction 302 of the reference layer 102. However, the magnetization direction 302 of the reference layer 102 is not switched because the torque, e.g., the amount of electrons, is not sufficient to overcome the damping and hence insufficient to cause switching in the reference layer 102.

Figure 3C:
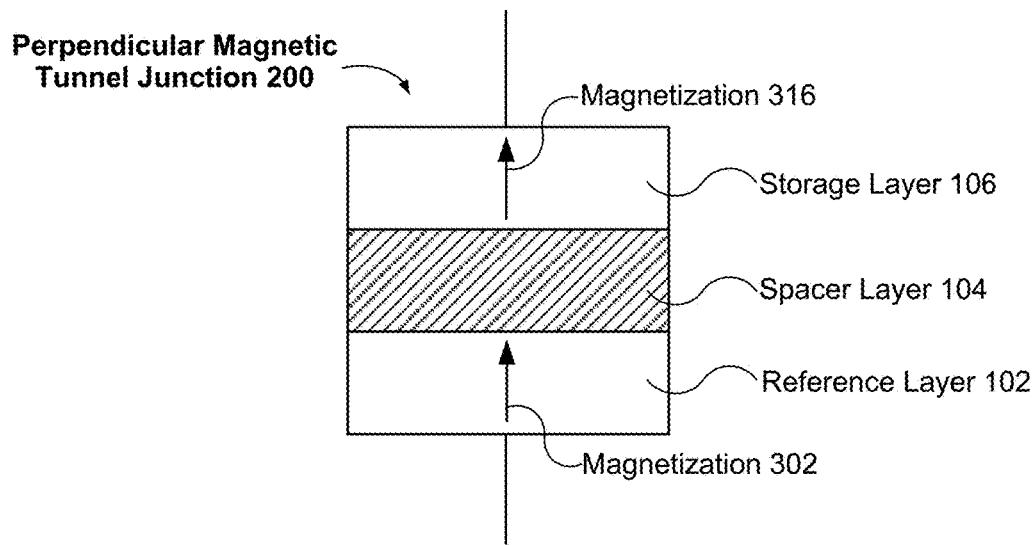
Figure 3D:
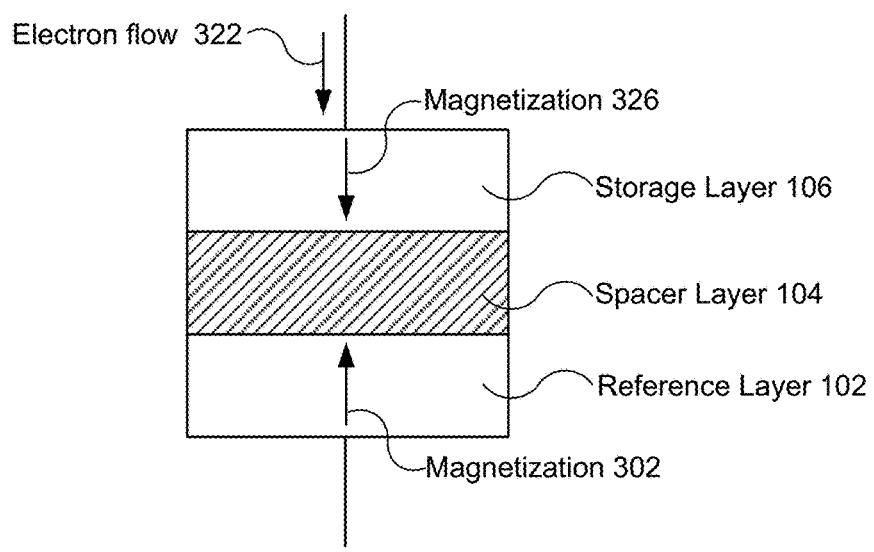

FIGS. 3C-3D illustrate the process of switching from the parallel configuration to the anti-parallel configuration. In FIG. 3C, the pMTJ structure 200 is in the parallel configuration. To initiate switching to the anti-parallel configuration, a current is applied such that electrons flow in accordance with electron flow 322 in FIG. 3D. The electrons flow from the storage layer 106 to the reference layer 102. As the electrons flow through the storage layer 106, they are polarized by the storage layer 106 and have spin orientation corresponding to the magnetization direction 316 of the storage layer 106.

The MTJ structure 200 in FIG. 3C is in the parallel (low resistance state) configuration and thus it has lower electrical resistance, therefore, in some implementations and instances, the majority of the spin-polarized electrons tunnel through the spacer layer 104. Minority spin electrons that are polarized with direction opposite to the magnetization direction 316 of the storage layer 106 are reflected at the barrier interfaces of the spacer layer 104. The reflected spin electrons then exert torque on the magnetization 316 of the storage layer 106, eventually leading to a switch of the magnetization direction 316 of the storage layer 106 in FIG. 3C to a magnetization direction 326 in FIG. 3D. Thus, the pMTJ structure 200 is switched from the parallel (low resistance state) configuration to the anti-parallel (high resistance state) configuration.

Accordingly, STT allows switching of the magnetization direction of the storage layer 106. MRAM devices employing STT (e.g., STT-MRAM) offer advantages including lower power consumption, faster switching, and better scalability, over conventional MRAM devices that use magnetic field to switch the magnetization directions. STT-MRAM also offers advantages over flash memory in that it provides memory cells with longer life spans (e.g., can be read and written to more times compared to flash memory).

Figure 4:
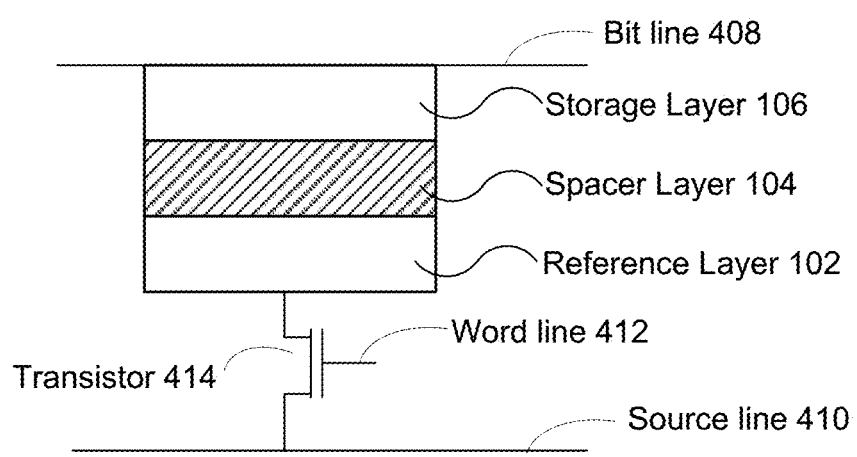
FIG. 4 is a schematic diagram of a representative spin transfer torque (STT) MRAM device in accordance with some implementations.

FIG. 4 is a schematic diagram of a spin transfer torque (STT) MRAM device 400 in accordance with some implementations. The includes an MTJ device with the reference layer 102, the spacer layer 104, the storage layer 106, and an access transistor 414. The MTJ device is coupled to a bit line 408 and a source line 410 via transistor 414, which is operated by a word line 412. The reference layer 102, the spacer layer 104, and the storage layer 106 compose the MTJ structure 100 and/or the pMTJ structure 200, as described above with reference to FIGS. 1-3. In some implementations, the STT-MRAM 400 includes additional read/write circuitry, one or more additional transistors, one or more sense amplifiers, and/or other components (not shown).

The MTJ structure 100 and/or the pMTJ structure 200 is also sometimes referred to as an MRAM cell. In some implementations, the STT-MRAM 400 contains multiple MRAM cells (e.g., hundreds or thousands of MRAM cells) arranged in an array coupled to respective bit lines and source lines. During a read/write operation, a voltage is applied between the bit line 408 and the source line 410 (e.g., corresponding to a "0" or "1" value), and the word line 412 enables current to flow between the bit line 408 to the source line 410. In a write operation, the current is sufficient to change a magnetization of the storage layer 106 and thus, depending on the direction of electron flow, bits of "0" and "1" are written into the MRAM cell (e.g., as illustrated in FIGS. 3A-3D). In a read operation, the current is insufficient to change the magnetization of the storage layer 106. Instead, a resistance across the MRAM cell is determined. e.g., with a low resistance corresponding to a logical "0" and a high resistance corresponding to a logical "1."

Dual Threshold Voltage Devices

The present disclosure describes various implementations of dual threshold (e.g., dual gate) voltage devices and systems. As discussed in greater detail below, dual threshold voltage devices are able to store multiple bits in a compact layout. Thus, memory arrays can be produced using the dual threshold voltage devices as memory cells. In addition, dual threshold voltage devices can be implemented as current and/or voltage selectors for other circuit components, such as magnetic memory devices. Some magnetic memory devices require inputs with multiple voltage levels in order to effectively read from and write to the devices. The dual threshold voltage devices are optionally used (e.g., in place of larger, more complex analog circuitry) to modulate a voltage or current source so as to provide the required voltage and/or current levels. Moreover, the input voltage requirements of some magnetic memory devices vary with the temperature of the magnetic memory devices. To achieve a desirable bit error rate (BER) across multiple temperatures, without excessive power consumption, a dual-threshold voltage is used in some implementations to regulate the input voltage/current for the magnetic memory device based on temperature.

Figure 5:
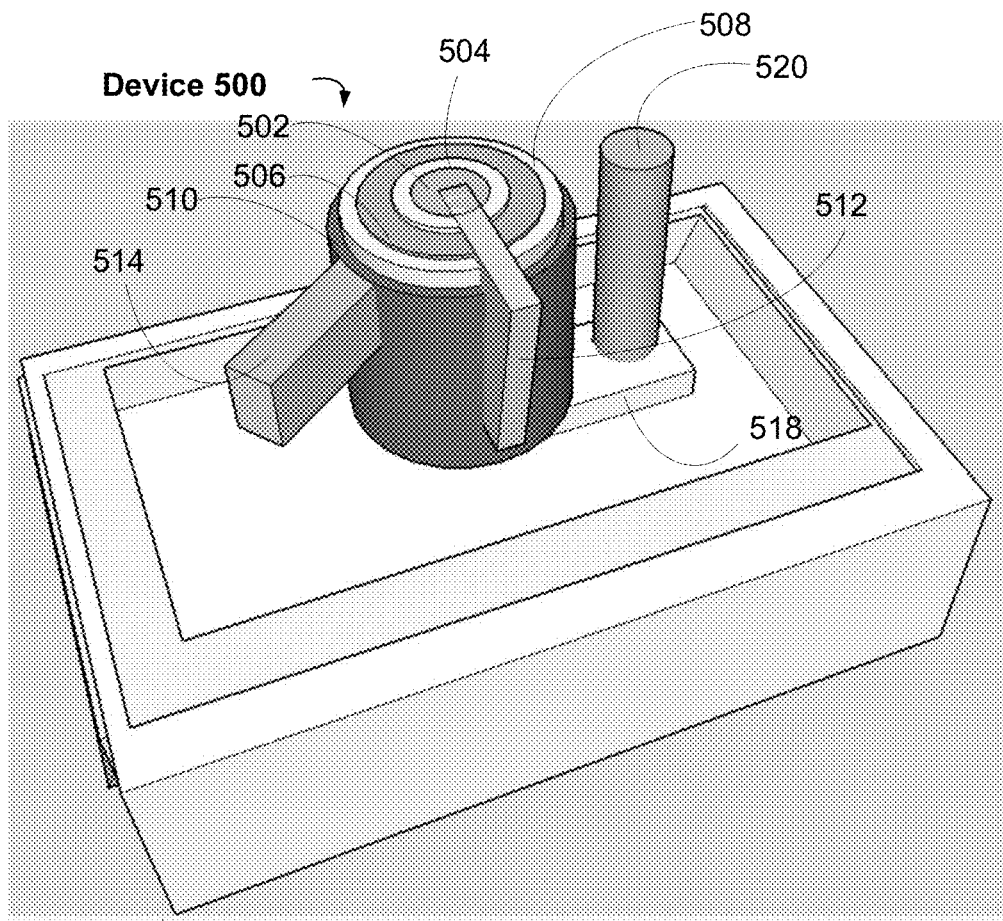
FIG. 5 illustrates a dual threshold voltage device in accordance with some implementations.

FIG. 5 illustrates a device (500) in accordance with some implementations. In some implementations, the device comprises a core 502 and a plurality of layers that surround the core in succession, including a first (e.g., innermost) layer 504, a second layer 506, a third layer 508 and a fourth (e.g., outermost) layer 510. In some implementations, the core 502, the first layer 504 and the second layer 506 constitutes part of a first transistor. In some implementations, the second layer 506, the third layer 508 and the fourth layer 510 correspond to a second transistor. In some implementations, the second layer 506 is a common channel for the first transistor and the second transistor. In some implementations, the device further includes a first input terminal 512 (e.g., connected to Gate 1) that is coupled to the core 502 and the first input terminal 512 is configured to receive a first voltage (e.g., is configured to have a first threshold voltage). In some implementations, the first threshold voltage is based on dopant type of the channel, dopant level of the channel, dielectric constant of first dielectric layer, thickness of first dielectric layer, and/or work function of the core. In some implementations, the device further includes a second input terminal 514 (e.g., connected to Gate 2) that is coupled to the fourth layer 510 and the second input terminal 514 is configured to receive a second voltage (e.g., is configured to have a second threshold voltage). In some implementations, the second threshold voltage is based on channel dopant type, channel dopant level, thickness of the third dielectric layer, and/or work function of the fourth conductive layer. The device further comprises a common source terminal 518 that is coupled to a source terminal of the channel (e.g., channel 804).

In some implementations, the first input terminal 512 and the second input terminal 514 are outwardly disposed from the center of the device. In some implementations, there is an angle between the disposition of the first input terminal 512 and the second input terminal 514 (e.g., the first terminal and second terminal are spaced such that they do not share a vertical plane).

In some implementations, the core is vertical and cylindrical in shape. In some implementations, the plurality of layers annularly surrounds the vertical cylindrical core and the core surrounded by the plurality of layers creates a cylindrical pillar (e.g., device 500 is shaped as a cylindrical pillar). For example, the cylindrical pillar comprises core 502, first layer 504, second layer 506, third layer 508, and fourth layer 510. Further, the cylindrical pillar includes the first input terminal 512, the second input terminal 514 and the drain terminal 506. In some implementations, the core is composed of electrically lower resistive material such as tantalum nitride (TaN).

In some implementations, the common source terminal 518 is composed of silicided areas coupled to a lower portion of the channel (e.g., the channel is also coupled to the drain of the device). Commonly, the cylindrical source contact 520 is used and installed to provide electrical connection to the source 518. Cylindrical source contact 520 provides methods to connect source of the dual voltage device to the outside power supply line.

In some implementations, the core 502 is composed of a conductive material, the first layer 504 is a first dielectric layer that surrounds the core 502, the second layer 506 surrounds the first dielectric layer 504, the third layer 508 is a third dielectric layer that surrounds the second layer 506 and the fourth layer 510 is composed of a conductive material and surrounds the third dielectric layer 508. For example, the fourth layer may be the outermost layer. In some implementations, the fourth layer 510 is composed of a polycide.

Figure 6:
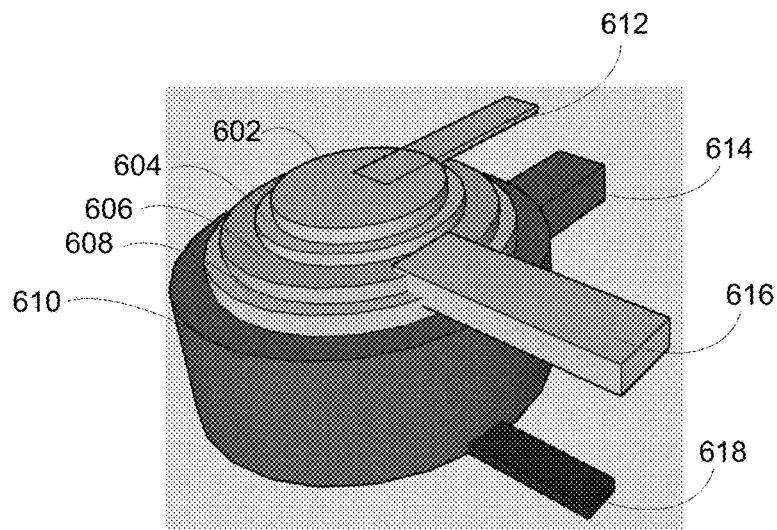
FIG. 6 illustrates a dual threshold voltage device with aligned gate handles in accordance with some implementations.
Figure 6:
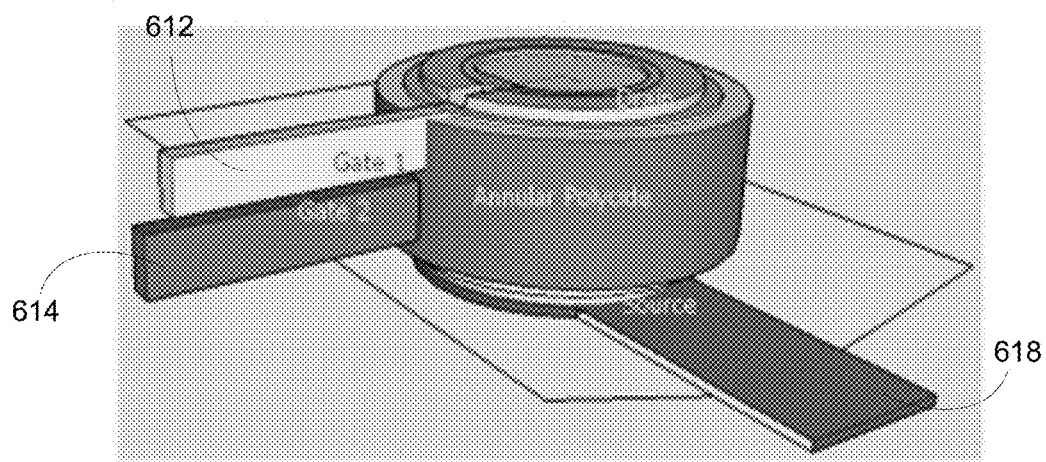

FIG. 6 illustrates two implementations of a device (600) in accordance with some implementations. In some implementations, device 600 has components corresponding to the components of device 500, described above, with the first input terminal and the second input terminal aligned to share a vertical plane (e.g., vertically stacked).

Figure 24:
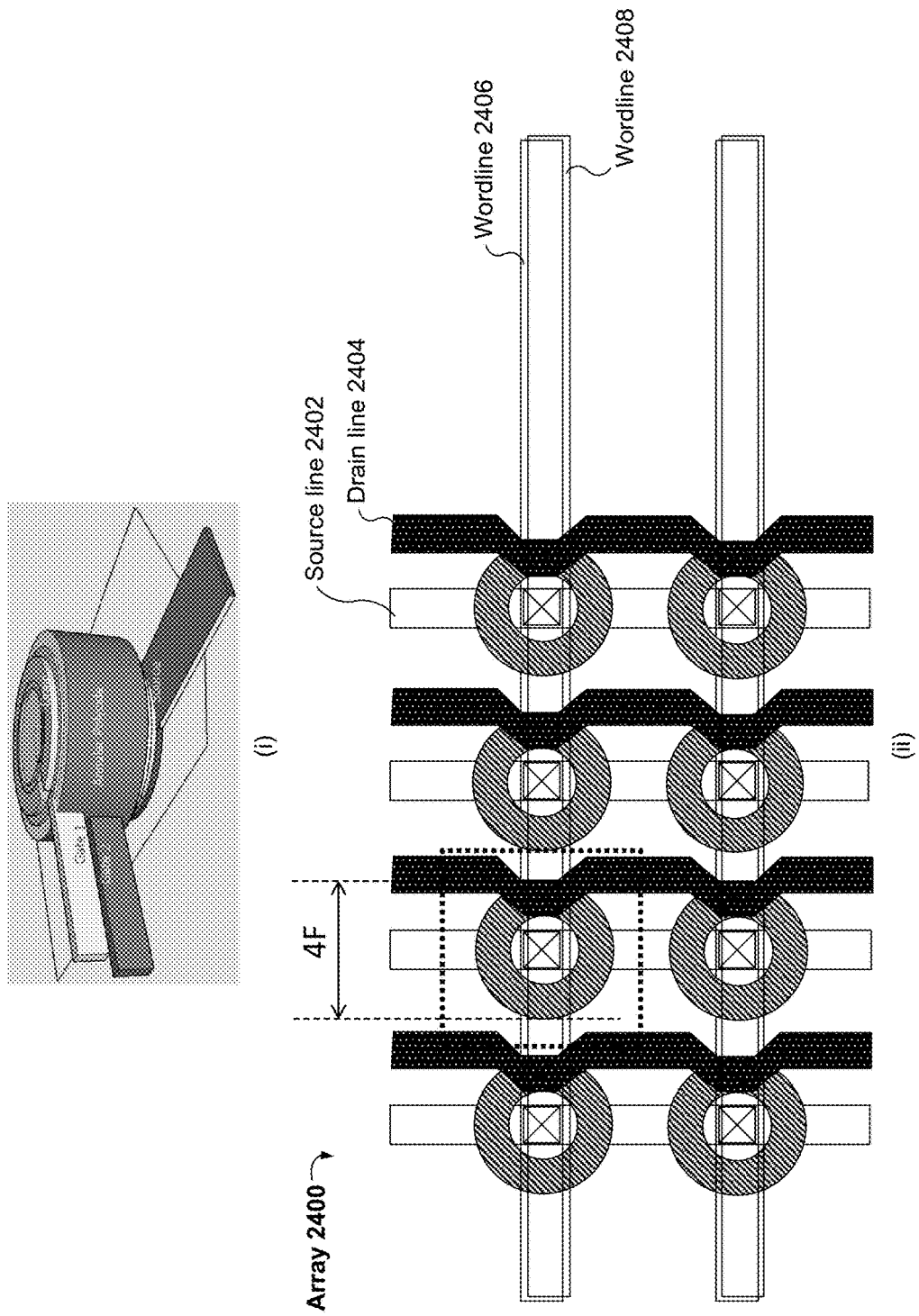
FIG. 24 illustrates an array of dual threshold voltage devices in accordance with some implementations.

In some implementations, the device 600 comprises a core 602 and a plurality of layers that surround the core in succession, including a first (e.g., innermost) layer 604, a second layer 606, a third layer 608 and a fourth (e.g., outermost) layer 610. In some implementations, the core 602, the first layer 604 and the second layer 606 correspond to a first transistor. In some implementations, the handle 616 (also sometimes called contact 616) connected to the 606 drain is not provided and/or is not used (e.g., is not coupled to another device or component). For example, the handle 616 is not used in some MRAM memory applications. In some implementations, the second layer 606, the third layer 608 and the fourth layer 610 correspond to a second transistor. In some implementations, the second layer 606 is a common channel (e.g., coupled to drain terminal 616) for the first transistor and the second transistor. In some implementations, the device further includes a terminal 612, also sometimes called a contact 612, (e.g., Gate 1 in example (ii)) that is coupled to the core 602 and the terminal 612 is configured to receive a first voltage (e.g., is configured to have a first threshold voltage). In some implementations, the device further includes a terminal 614 (e.g., Gate 2 in example (ii)) that is coupled to the fourth layer 610 and the terminal 614 is configured to receive a second voltage. The first input terminal 612 and the second input terminal 614 are stacked on top of each other (e.g., vertically aligned). In accordance with some implementations, stacking the terminals 612 and 614 enable production of an array of devices with a smaller pitch, as shown in FIG. 24.

In some implementations, an annular device (e.g., device 600) is provided. The annular device comprises a first transistor including a first input terminal (e.g., gate 1 handle) and a second transistor including a second input terminal (e.g., gate 2 handle). In some implementations, the first input terminal and the second input terminal extend radially outward from the annular device 600 and the first input terminal is aligned with the second input terminal.

In some implementations, a magnetic tunnel junction (MTJ) coupled to the channel drain (e.g., at the top/above the cylindrical core), as described in greater detail with reference to FIG. 8.

In some implementations, the core is vertical and cylindrical in shape, the plurality of layers annularly surrounds the vertical cylindrical core, and the core surrounded by the plurality of layers creates a cylindrical pillar. In some implementations, the first transistor is configured to have a first threshold voltage having a first magnitude and the second transistor is configured to have a second threshold voltage having a second magnitude. In some implementations, the second magnitude is distinct from the first magnitude.

In some implementations, the first threshold voltage and the second threshold voltage are based on a respective thickness for each of the dielectric layer thicknesses and the dopants of the channel and work function of the core and the plurality of layers.

In some implementations, the first threshold voltage and the second threshold voltage are selected by changing one or more properties of the device selected from the group consisting of: a dopant of the device, a thickness of one or more of the plurality of layers, and material compositions of the first transistor and the second transistor. In some implementations, the common source terminal is composed of silicided areas coupled to a bottom plane of the core and the fourth layer.

In some implementations, the core is composed of a conductive material, the first layer is a first dielectric layer that surrounds the core, the second layer surrounds the first dielectric layer, the third layer is a third dielectric layer that surrounds the second layer, and the fourth layer is composed of a conductive material and surrounds the third dielectric layer.

In some implementations, the fourth layer is composed of a polycide. In some implementations, the core is composed of a nitride (e.g., TaN). In some implementations, the device further comprises a cylindrical source contact (e.g., source contact 520) coupled to the common source. In some implementations, the second layer has a height that is distinct from (e.g., greater than) a height of the core. In some implementations, the second layer has a height that is distinct from (e.g., greater than) a respective height of the third layer and the fourth layer.

Figure 7:
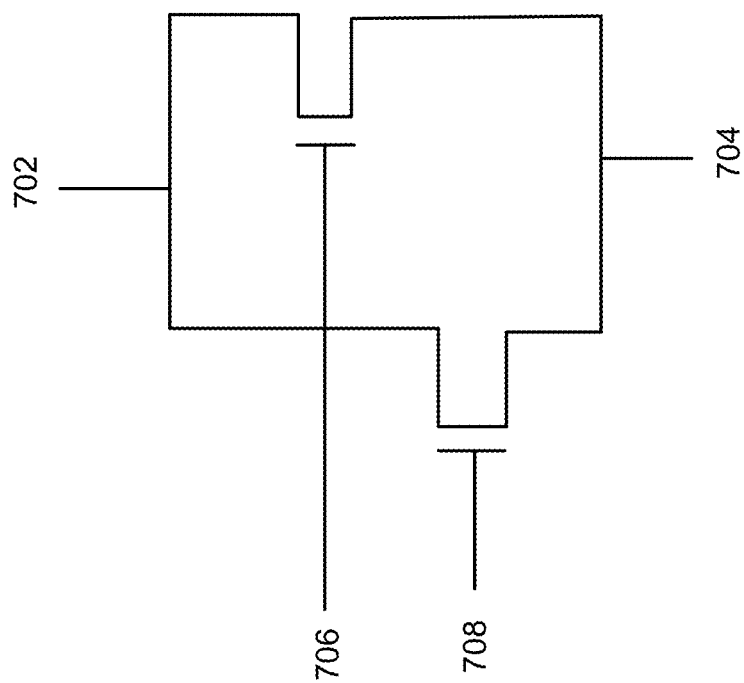
FIG. 7 is a schematic diagram of a representative circuit in accordance with some implementations.

FIG. 7 shows a schematic circuit that exemplifies operation of the device 500. In some implementations, the first transistor (e.g., having a first gate 706) is configured to have a first threshold voltage (e.g., Vt1) having a first magnitude and the second transistor (e.g., having a second gate 708) is configured to have a second threshold voltage (e.g., Vt2) having a second magnitude. In some implementations, the second magnitude is distinct from the first magnitude (e.g., the first threshold voltage of the first transistor is distinct from the second threshold voltage of the second transistor). For example, the first threshold voltage may range from 0.15 V to 2 V and the second threshold voltage may range from 0.3V to 3V. In some implementations, the threshold voltages are negative voltages. In some implementations, gate 706 corresponds to the core 502 and gate 708 corresponds to the fourth layer 510. In some implementations, the drain 702 (e.g., Vd) is coupled to the second layer 506 and a source 704 (e.g., Vs) is coupled to the device via the silicide strip 602.

In some implementations, the first voltage and the second voltage are based on a dopants and their levels of the cylindrical pillar channel. It is to be noted that to have a larger drive current dual Vt device, a thicker cylindrical pillar may give a greater drive current. In some implementations, the first threshold voltage value and the second threshold voltage value are selected (e.g., configured) by changing one or more properties of the device 500. The one or more properties may be selected from the group consisting of a dopant of the device, a thickness of one or more of the plurality of layers, and material compositions of the first transistor and the second transistor.

Figure 8:
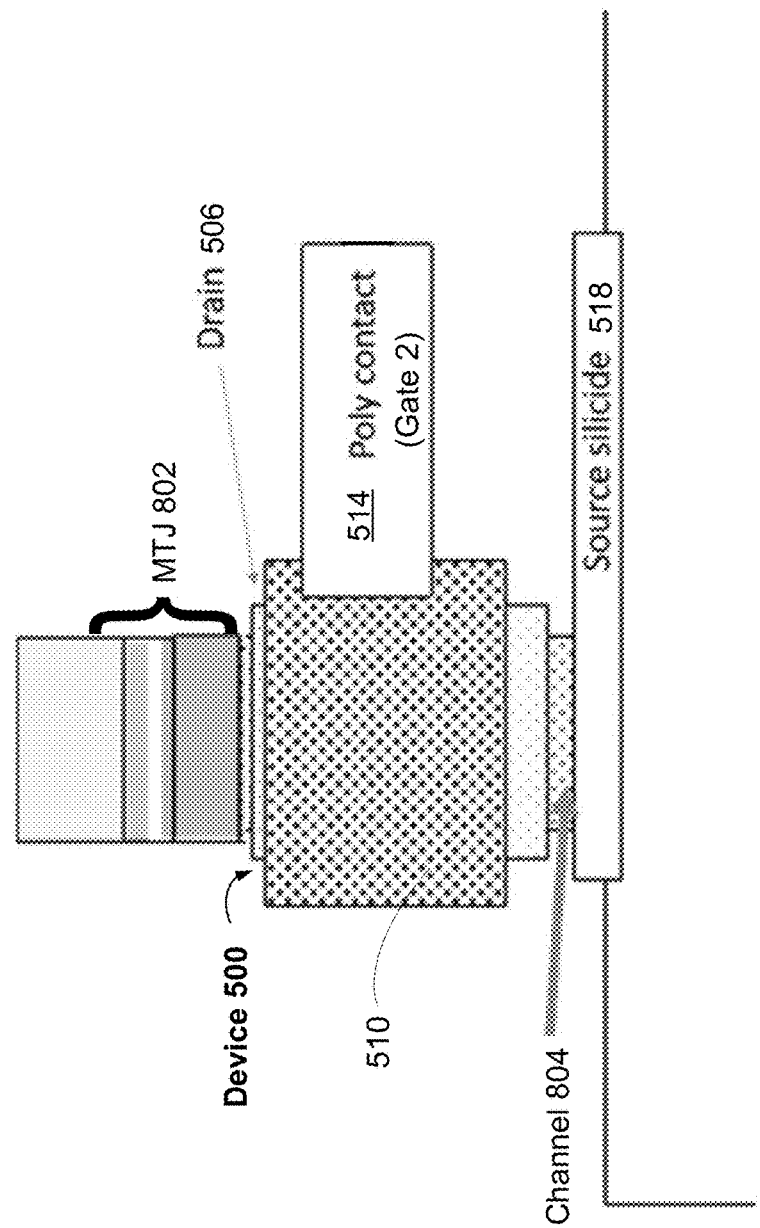
FIG. 8 is a schematic of a dual threshold voltage device and MTJ structure in accordance with some implementations.

FIG. 8 shows an MTJ 802 coupled with the device 500. Device 500 includes core 502 (e.g., gate 706), first layer (not shown), second layer 506 (e.g., drain), third layer (not shown) and fourth layer 510 having contact terminal 514. Device 500 further includes a silicide source (e.g., common source 518) and a channel 804. Channel 804 may be disposed between (e.g., coupled to) silicide source 518 and drain 506 (e.g., where drain 506 extends through the height of device 500). In some implementations, the device 500 further comprises a magnetic tunnel junction (MTJ) 802 (e.g., which rests on drain 506).

FIGS. 9-15 illustrate a process for forming a silicide source in accordance with some implementations. To that end, a method of fabricating a device (e.g., an annular device) is provided. The method comprises providing a device having two transistors sharing a common silicide source. In some implementations, the method comprises providing (e.g., forming) a device 500 having a conductive core corresponding to a first transistor and a plurality of layers surrounding the core. In some implementations, the device is a cylindrical device (e.g., cylindrical pillar 600) having a conductive core 502 corresponding to a first transistor and a plurality of annular layers surrounding the core, including a first dielectric layer, a second layer, a third dielectric layer (e.g., the third layer is a dielectric layer), and a fourth conductive layer (e.g., the fourth layer is a conductive layer) corresponding to a second transistor. The method further comprises creating a silicide source (e.g., silicide source 518), wherein the silicide source is coupled with the two transistors.

In some implementations, creating the silicide source 518 comprises depositing multiple layers in succession on an oxide substrate, the multiple layers including at least an oxide layer and a planarization layer. The method further comprises removing, at least partially, the oxide layer and the planarization layer until the oxide substrate is exposed and removing, at least partially, the oxide layer to expose a horizontal cross section of the cylindrical device to create an annular area. The method further comprises, after the removing, depositing a siliciding metal on the annular area to form the silicide source.

In some implementations, the method further comprises depositing the siliciding metal and performing a first rapid thermal annealing (RTA) and then removing the unreacted siliciding metal. In some implementations, the annular area is at a bottom of the cylindrical device.

In some implementations, providing the cylindrical device having the two transistors comprises: (i) providing a conductive core corresponding to a first transistor of the two transistors, and (ii) forming a plurality of cylindrical layers around the conductive core, including a first dielectric layer, a second channel layer, a third dielectric layer, and a fourth conductive layer (e.g., a poly layer) corresponding to a second transistor of the two transistors. In some implementations, the second layer of the cylindrical device corresponds to a channel. In some implementations, the method further comprises removing the siliciding metal from the second layer of the cylindrical device, where removing the siliciding metal leaves a residual reacted metal forming the silicide source.

In some implementations, the method further comprises applying a mask prior to removing one or more layers (e.g., before an etching operation) so as to selectively remove portions of the one or more layers. For example, a mask could protect the cylindrical core and one or more layers of the plurality of cylindrical layers during the removing.

In some implementations, forming the plurality of cylindrical layers around the cylindrical core comprises depositing a spin-on glass (SOG) layer on a first plane of the cylindrical device to create a sloped ring around the bottom of the cylindrical device, wherein the cylindrical device is vertically disposed in the first plane and the SOG layer surrounds the cylindrical device. The method further comprises etching the SOG layer from around and inside the cylindrical device to a desired depth and depositing one or more dielectric materials to form the third dielectric layer. The method further comprises depositing a doped material on the first plane, a horizontal cross section of the cylindrical device, a top of the cylindrical device, and the sloped ring. The method further comprises etching the doped material on the top of the cylindrical device and on the sloped ring and depositing a siliciding metal to create the fourth conductive layer.

In some implementations, the method further comprises performing a third RTA to finish creation of the fourth conductive layer. In some implementations, the method further comprises wet etching the unreacting siliciding metal after the third RTA.

In some implementations, the oxide layer is a first oxide layer and the method further comprises creating a contact to the second transistor of the two transistors, including depositing a second oxide layer to create an oxide plane, depositing a spin-on glass (SOG) layer on the oxide plane, wherein the cylindrical device is vertically disposed in the oxide plane, depositing an organic compound to a first height to create an organic planarization layer (OPL), wherein the OPL surrounds a horizontal cross section of the cylindrical device, depositing a third oxide layer onto the OPL, wherein the third oxide layer surrounds a horizontal cross section of the cylindrical device, depositing anti-reflective coating on the third oxide layer, masking these layers and then removing the deposited layers from areas governed by the mask layout using a first removal technique. Next, the OPL is removed using a second removal technique until the SOG layer is exposed, thereby forming a trench and depositing a metallic compound in the trench to create the contact to the second transistor gate.

In some implementations, the method further comprises etching the SOG layer to a first thickness before depositing the organic compound. In some implementations, the positioning of the upper and the lower edge of Gate 2 contacts to second transistor are adjusted by varying the thickness of the layers (e.g., varying the thickness of layers 1904, 1906, and 1908 in FIGS. 19A and 19B). In some implementations, the first removal technique is a fluorine-based chemistry.

In some implementations, the method further comprises depositing a photoresist layer on the anti-reflective coating, wherein the anti-reflective coating and the photoresist layer surround a horizontal cross section of the cylindrical device.

In some implementations, the method further comprises creating a mask with the photoresist layer before removing the anti-reflective coating and the second oxide layer using the fluorine-based chemistry, wherein said removing is defined by the mask of the photoresist layer. In some implementations, the second removal technique uses oxygen plasma to remove the OPL. In some implementations, the compound is tantalum nitride.

In some implementations, the method further comprises creating a contact to the first transistor of the two transistors (e.g., innermost metallic gate), including depositing, on top of the plurality of cylindrical layers, a metal gate contact material, etching through the plurality of cylindrical layers and the metal gate contact material to a first height extending across the conductive core through the fourth layer (i.e., forming a trench), depositing a first mask, depositing a layer of silicon nitride (SiN) (e.g., in the formed trench), depositing a second mask and etching the layer of SiN in accordance with the second mask to create a flat surface, and depositing a metal gate contact on the flat surface to create a contact to the first transistor. Using the SiN ensures that the metal gate contact (e.g., Gate 1 contact metal) does not short any conductive annular layers of either of the transistors.

In some implementations, the metal gate contact material is tantalum nitride. In some implementations, the first height is based on the height of a second highest layer of the plurality of layers. In some implementations, the method further comprises, after depositing the first mask, wet dipping the plurality of layers in potassium hydroxide in accordance with the mask. In some implementations, the wet dipping decreases the height of the third layer and the fourth layer. In some implementations, the layer of silicon nitride is thick SiN. In some implementations, the method further comprises performing a chemical mechanical polishing (CMP) on the layer of SiN.

Figure 9A:
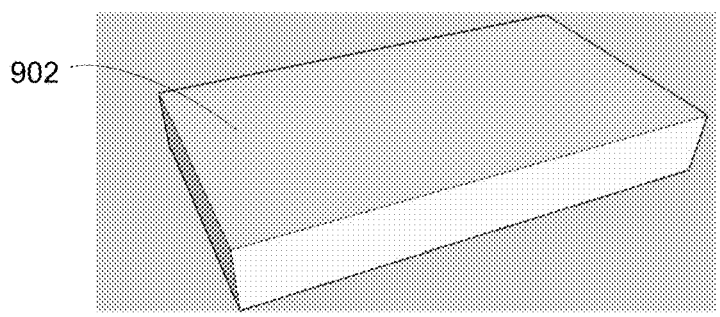
FIGS. 9A-9C illustrate a process of forming a channel in accordance with some implementations.
Figure 9B:
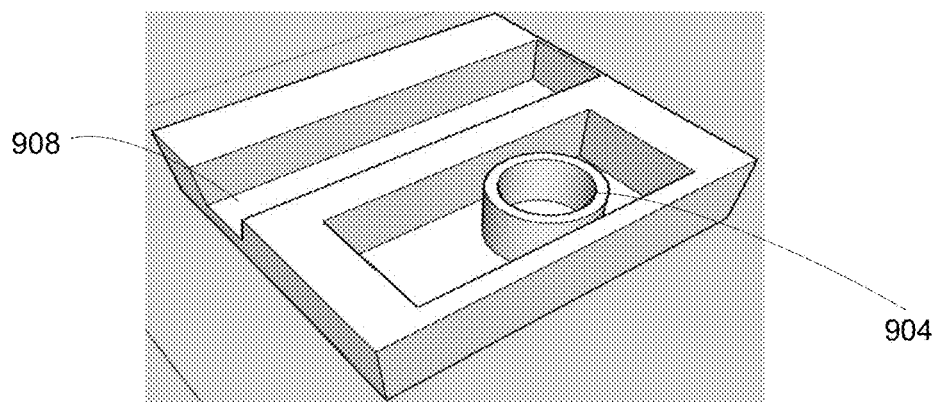
Figure 9C:
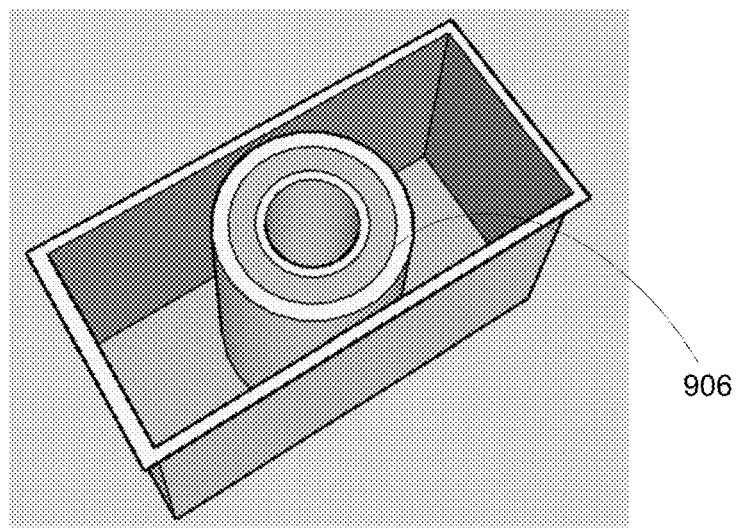

In some implementations, the process starts with Silicon (Si) (e.g., Silicon having a (110) lattice structure), and the process comprises depositing or growing and converting a small part of Silicon itself to its Silicon dioxide compound, a thin oxide layer onto the Si to create a planar layer 902, as shown in FIG. 9A, which provides necessary masking materials to etch shallow trench isolation and active transistor/device areas. The process further comprises creating a mask with a shallow trench isolation (STI) 908 and a channel 904 (e.g., a cylindrical channel), and removing the Si (e.g., by dry etching and/or wet etching the Si), as shown in FIG. 9B. In some implementations, the channel 904 corresponds to channel 804 as shown in FIG. 8. As shown in FIG. 9C, the process further comprises growing the oxide to the required thickness for silicide formation (e.g., to create oxide-covered cylindrical channel 906). For example, the oxide will grow at the bottom of the cylindrical channel, on the inside of the cylinder, and on the outside of the cylinder.

FIG. 10A illustrates doping a P-device (e.g., PMOS) and/or an N-device (e.g., NMOS) to configure the transistors to proper magnitude (e.g., to positive or negative threshold voltages) (e.g., the first transistor is configured to have a first threshold voltage and the second transistor is configured to have a second threshold voltage). For example, the process may further comprise creating a mask and doping the P-device (e.g., P pillar) with Boron high angled multiple Ion Implant in order to adjust the threshold voltage of the P-device. In some implementations, the process may further comprise creating a mask and doping the N-device (e.g., N pillar) with Phosphorous high angled multiple Ion Implant in order to adjust the threshold voltage of the N-device. In some implementations, the method further comprises performing rapid thermal annealing (RTA) to activate the dopants in the P-device and/or N-device. In some implementations, the outside and inside of the pillars (e.g., barrels) are doped in order to adjust the threshold voltage of the pillars. In some implementations, the mobility of the semiconductor material affects the threshold voltage. It is noted that other doping agents could also be used for the doping operation explained above, and the examples provided are merely one set of possible doping agents. In some implementations, the process creates a P-device or an N-device. In some implementations, both a P-device and an N-device may be created, as described with reference to FIG. 14.

Figure 11A:
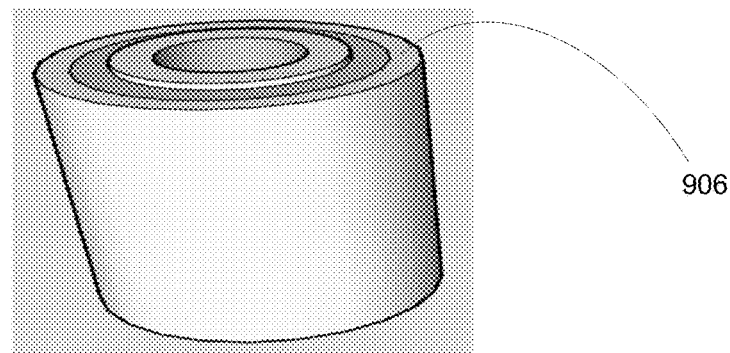
FIGS. 11A-11C illustrate a process of forming annular layers in accordance with some implementations.
Figure 11B:
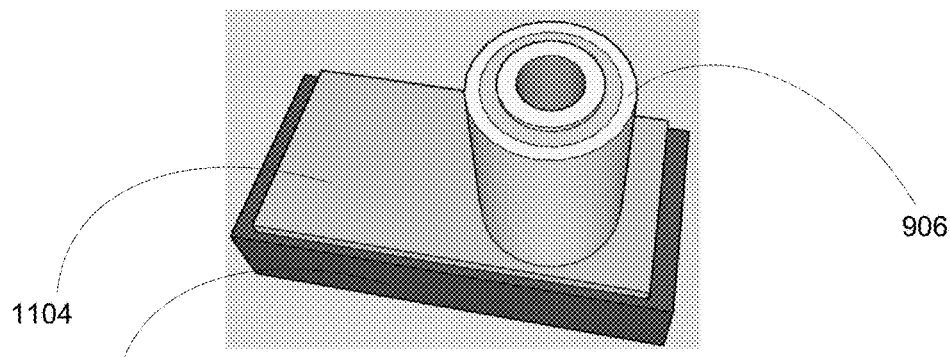

FIG. 11 illustrates the process of silicide formation of the common source. FIGS. 11A and 11B show the annular channel 906 (e.g., the common channel extending from below the so called source to the top layer called the drain). Creating the silicide source includes depositing a plurality of layers in succession on an oxide substrate (e.g., the oxide grown as described with respect to FIG. 9). The plurality of layers includes at least an oxide layer and a polymerizing layer (e.g., an organic polymerizing layer (OPL) 1102). In some implementations, as discussed below, the layers may also include a low temperature silicon oxide (LTO) layer, an antireflective layer, and/or a photoresistive layer. The process further includes removing, at least partially, the oxide layer and the polymerizing layer until the oxide substrate is exposed using a first removal technique (e.g., dry etching). In some implementations, the removal is in accordance with a mask (e.g., mask 1204, FIG. 12B) over the second layer. The process further includes removing, at least partially, the oxide layer to expose a layer of silicon on a horizontal cross section of the device using a second removal technique (e.g., which may be the same technique as the first removal technique or may be a different technique, such as dry and/or wet etching). In some implementations, where the device is a cylindrical device this creates an annular area 1302 (e.g., at the bottom of the device). After the Ion Implant for the source and the removing of the Photoresist, the process includes performing a first rapid thermal annealing (RTA) on the area which creates a low resistivity contact to the source of either transistor. Then, depositing a siliciding metal on the area to form the silicide source. The process further includes performing a second RTA, which produces a very low resistive contacts to source areas of both transistors.

Figure 11C:
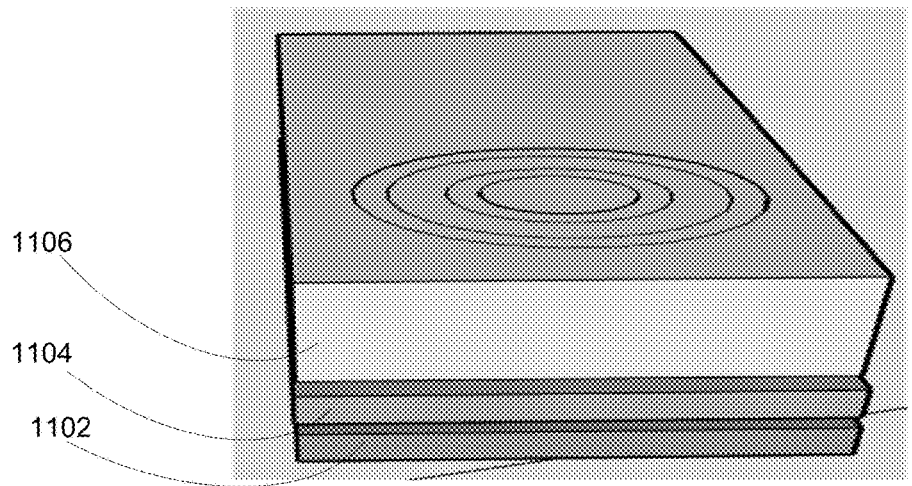
Figure 12A:
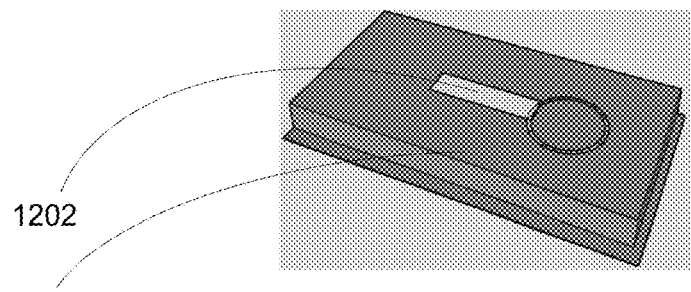
FIGS. 12A-12C illustrate an etching process in accordance with some implementations.
Figure 12B:
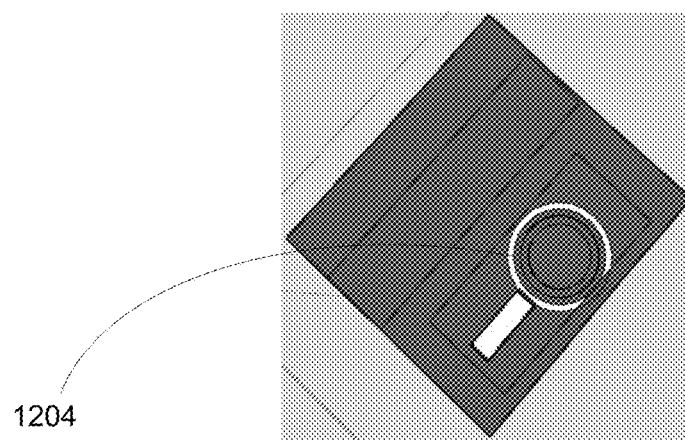
Figure 12C:
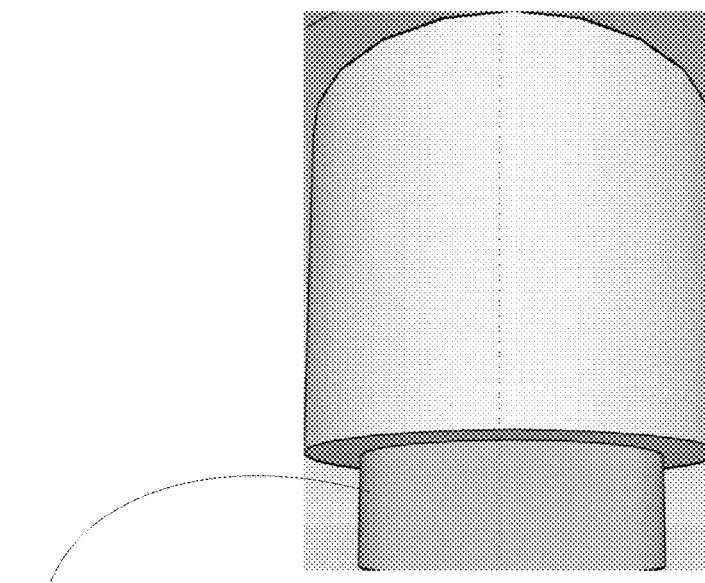

In some implementations, the process of formation of the source silicidation includes coating (e.g., depositing) a first oxide (e.g., a thin film) on silicon, then coating it with an organic polymerizing layer (OPL) to create an OPL plane 1102, wherein the OPL plane 1102 surrounds a horizontal cross section of the cylindrical device 906. In some implementations, the polymerizing layer (e.g., OPL) is thinned down to a required thickness for the silicide formation. The process further includes depositing low-temperature silicon oxide (LTO) on the OPL to create an LTO layer 1104, wherein the LTO layer 1104 surrounds a horizontal cross section of the cylindrical device 906. The process further includes coating the LTO layer 1104 with a bottom antireflective coating (BARC) layer and a photoresistive (PR) layer 1106, as shown in FIG. 11C. The process further includes applying a layer of silicide 1202.

Figure 13A:
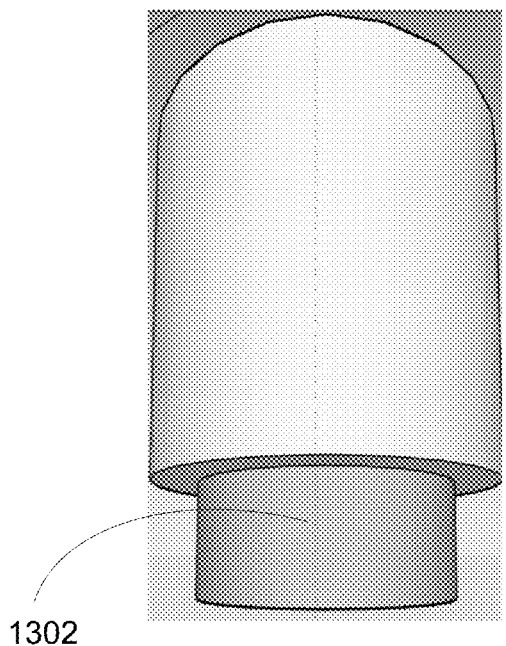
FIGS. 13A-13B illustrate an annular device in accordance with some implementations.
Figure 13B:
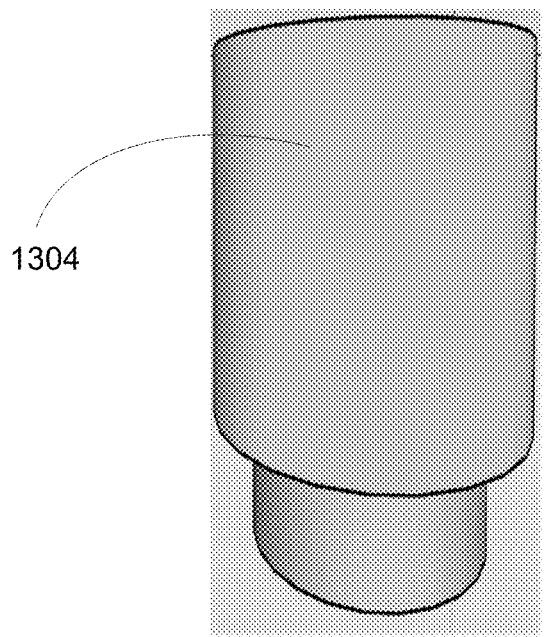

In some implementations, the process further includes creating a mask 1204 with the PR layer, wherein the mask 1204 covers the second layer (e.g., channel) of the cylindrical device 906. The process further includes dry etching (e.g., using a high pressure controlled dry etch) the BARC layer, the LTO layer and the OPL until the oxide substrate 1206 is exposed. For example, the center of the cylindrical channel is covered with masking PR such that the center of the channel barrel is not exposed (e.g., is not effected) for this dry etching or the following etching and siliciding. In some implementations, the dry etching is fluorine-based (e.g, NF3 and/or SF6). The process further includes, as shown in FIG. 13, etching horizontally the LTO layer and oxide (e.g., at the bottom of the device) to expose a layer of silicon on a horizontal cross section of the cylindrical device to create an annular area 1302. For example, wet etching may be used for etching the LTO layer on the outside of the cylinder. The process further includes Ion Implanting the source dopant and performing a first rapid thermal anneal (RTA) processing on the annular area 1302 (e.g., the inside and/or outside of the channel above the annular area are not exposed to source ion implant and are covered in PR). In some implementations, the annular channel is unaffected by the Ion Implant processing, and the metal siliciding process. In some implementations, the PR layer and OPL is stripped off (e.g., the inside of the channel is oxide).

In some implementations, the horizontal etching is wet etching and/or dry etching (e.g., performed sequentially). In some implementations, the second layer of the cylindrical device corresponds to a channel and the channel is not exposed to the etching of the BARC layer, the LTO layer and the OPL.

The process further includes depositing a siliciding metal (e.g., Ti 50 nm) on the annular area 1302 to create the silicide source and performing a second Rapid Thermal Annealing. In some implementations, the annular area 1302 is at the bottom of the cylindrical device.

Figure 14:
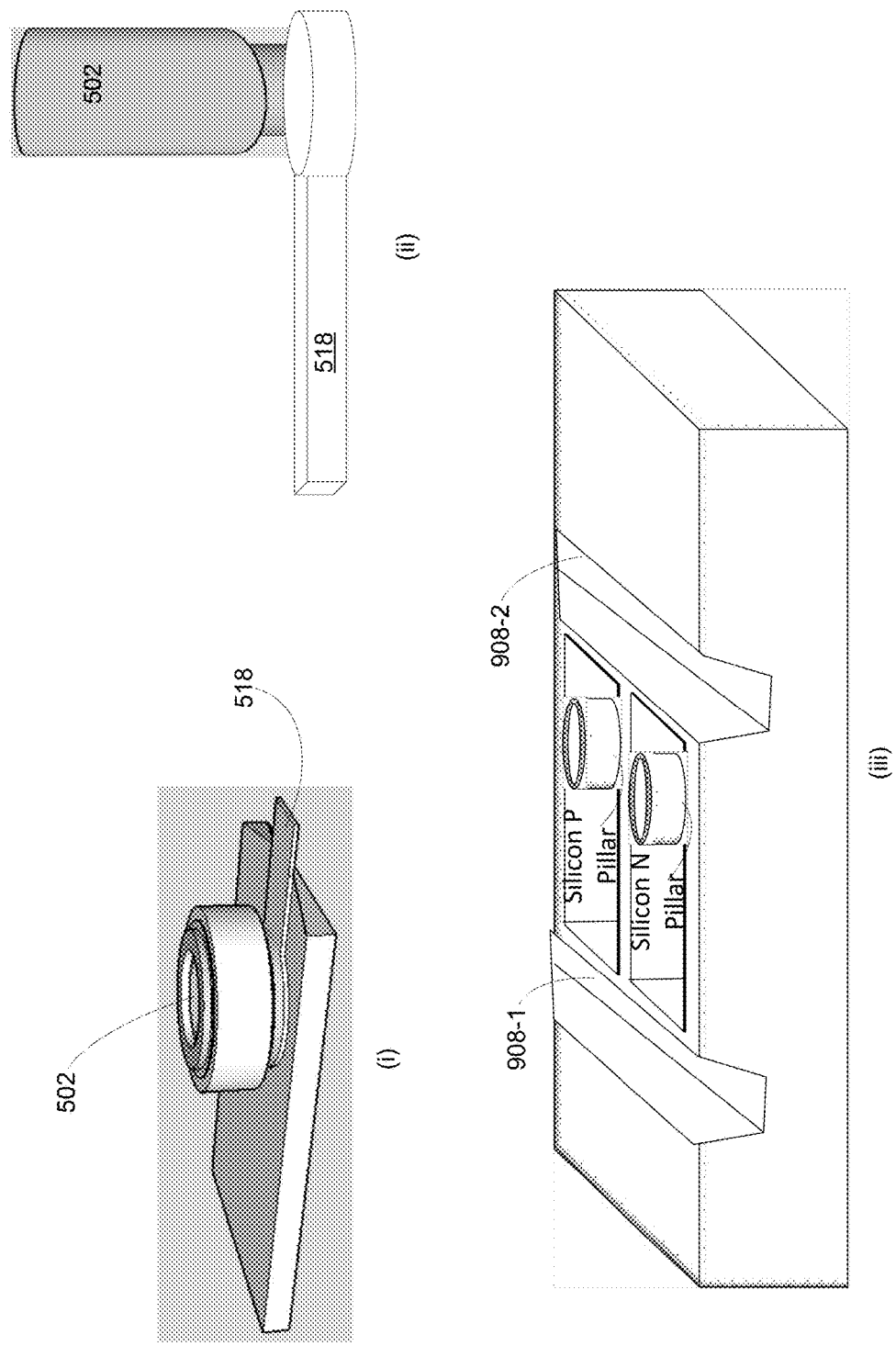

FIG. 14 a schematic view of both an N-device and a P-device. The view includes STI 908-1 and 908-2, a silicon P-device and a silicon N-device put together, for example, to create a CMOS device. In some implementations, an N-device and a P-device may both be configured and fabricated and in other configurations, either type of devices can be made. FIG. 14 also illustrates the device core 502 and source terminal 518 that is coupled to the device core 502. STI areas 908-1 and 908-2 serve to isolate the neighboring devices from each other.

Figure 15A:
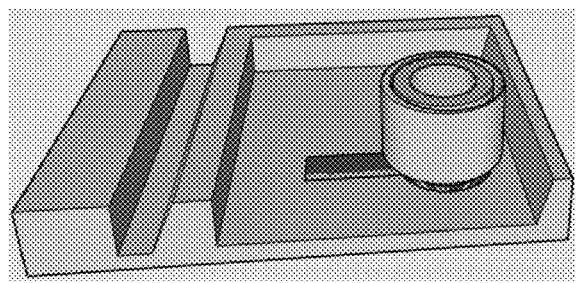
FIGS. 15A-15C illustrate a siliciding process in accordance with some implementations.
Figure 15B:
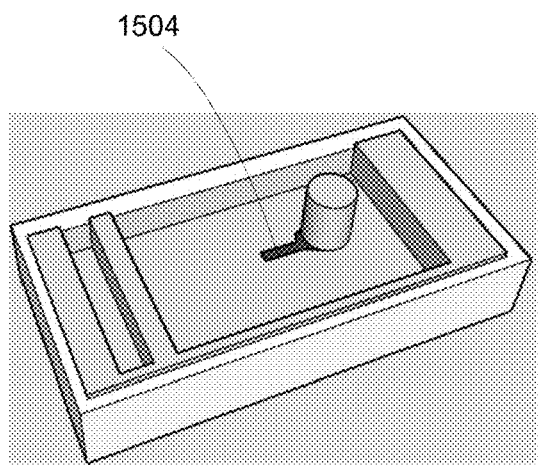
Figure 15C:
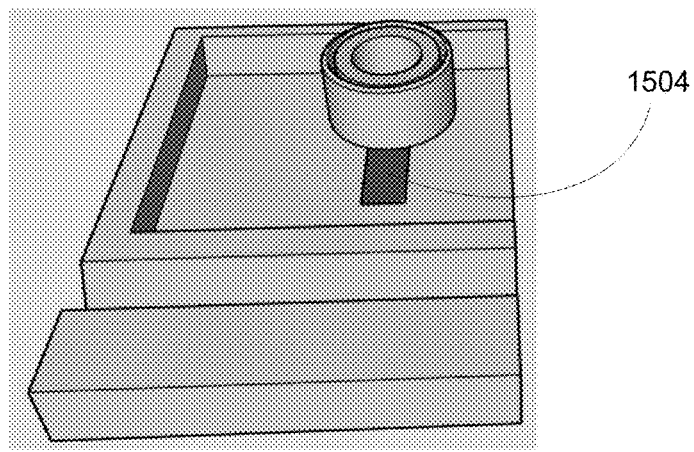

FIGS. 15A, 15B and 15C show siliciding process steps in accordance with some implementations. FIG. 15A shows an oxide layer covering most of the area but a small portion of area shows exposed Silicon. FIG. 15B shows the surface areas after depositing the siliciding metal all over. Here, only a small area of Silicon is in direct contact with siliciding metal which converts to low resistivity silicide area. FIG.

15C, the area 1504 and the top annular Silicon area become low resistivity material of metal silicide. In some implementations, the siliciding metal that is deposited is titanium or another metal. The siliciding metal connects (e.g., mixes and/or reacts) with areas that have silicon exposed (e.g., including the annular area 1302, FIG. 13A). For example, the siliciding metal may be deposited over the entire device, but the siliciding metal may only fuse the previously exposed silicon along strip 1504 (e.g., an annular area 1302, FIG. 13A) and the top annular area of FIG. 15C.

In some implementations, the method further comprises removing the siliciding metal from the second layer 506 (e.g., the channel drain) of the cylindrical device (e.g., using hydrogen peroxide or another compatible chemical), wherein the removal leaves a residual reacted metal along strip 1504, forming (e.g., leaving) the silicide source. In some implementations, removing the unreacted siliciding metal (e.g., unreacted Ti) includes wet etching the metal.

Figure 16A:
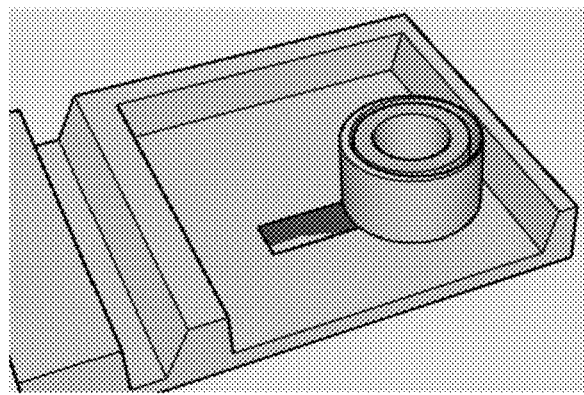
FIGS. 16A-16C illustrate a process of forming a gate structure on an annular device in accordance with some implementations.
Figure 16B:
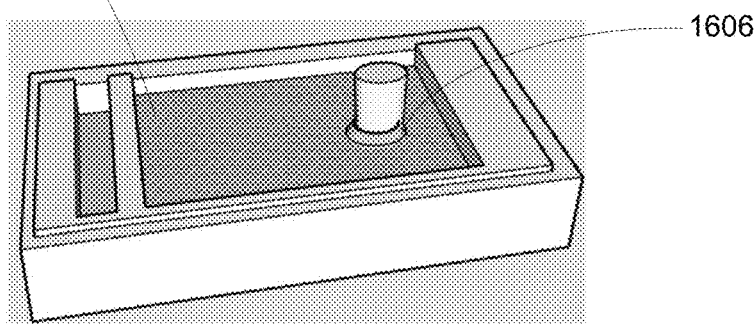
Figure 16C:
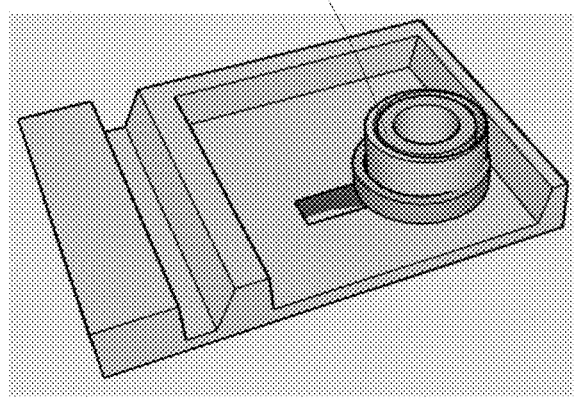
Figure 17A:
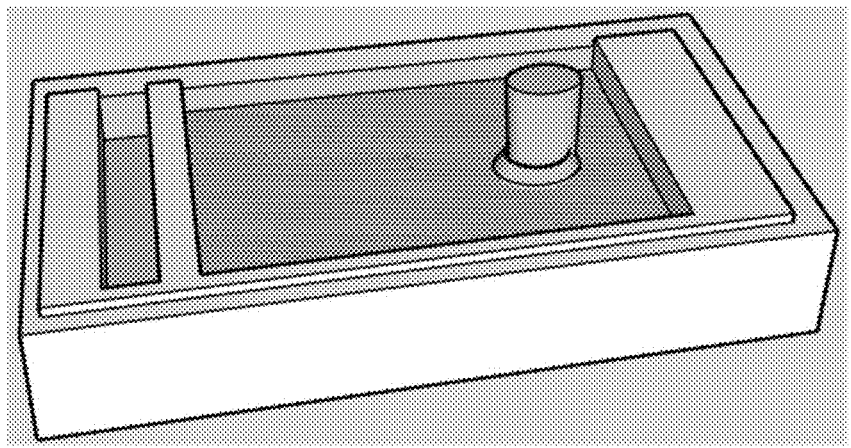
FIGS. 17A-17B illustrate a process of depositing polysilicon on an annular device in accordance with some implementations.
Figure 17B:
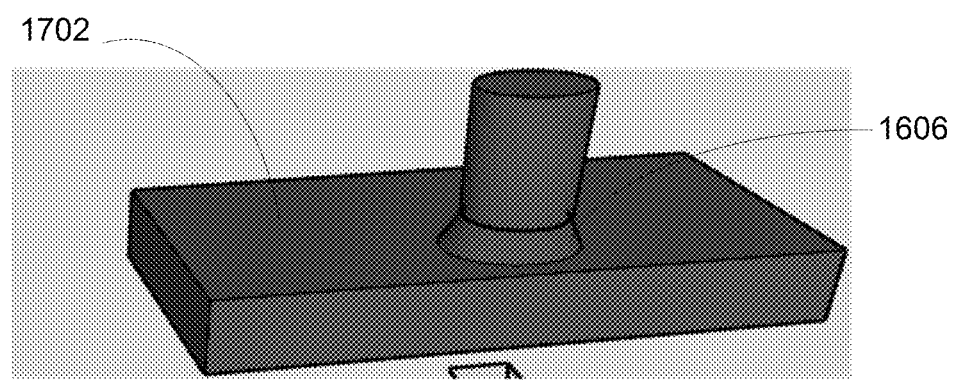
Figure 18:
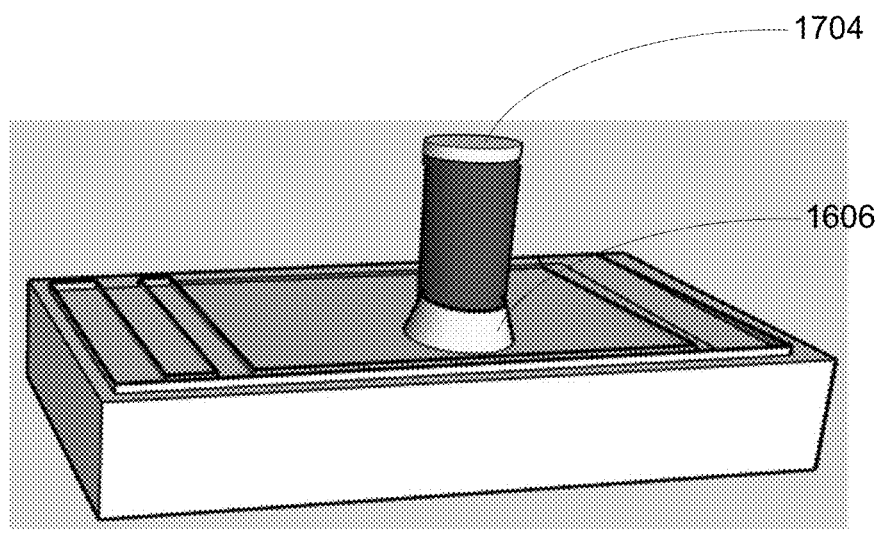

FIGS. 16-18 illustrate process states for forming a Gate 2 structure for the transistor in accordance with some implementations. For example, a method is provided to form a wrap-around annular poly gate (e.g., a gate of a transistor), such as, in some implementations, the fourth layer 510 shown in FIG. 5. In some implementations, the method comprises forming a device 500 (e.g., a cylindrical device) having a conductive core 502 corresponding to a first transistor (e.g., a first gate of a first transistor) and a plurality of annular layers surrounding the core 502, including a first dielectric layer 504, a second layer 506, a third dielectric layer 508, and a fourth conductive layer 510 corresponding to a second transistor (e.g., a second gate of a second transistor). For example, the cylindrical channel shown in FIG. 16A is provided and the following process describes forming the fourth layer around the cylindrical channel. In some implementations, any remaining SOG from previous processing is stripped off in FIG. 16A.

The method comprises coating (e.g., depositing) a spin-on glass (SOG) layer 1604 on a first plane (e.g., on which the device rests) and coating the device to create a sloped ring 1606 (e.g., or other sloped shape surrounding the shape of the device 500, such as a square) around the bottom of the cylindrical device, wherein the device (e.g., cylindrical device) is vertically disposed in the first plane and the SOG surrounds the cylindrical device. The method further comprises etching (e.g., removing) the SOG layer from around and inside the cylindrical device to a desired depth and depositing dielectric materials to form the third dielectric layer 1608 (e.g., the third layer is a dielectric layer) (e.g., such that oxide grows on all surfaces of the cylindrical device) to create the device shown in FIG. 16C. The method further includes depositing doped material (e.g., a chemically vaporized deposit (CVD) polysilicon 1702) (e.g., the dark shading) on the first plane, a horizontal cross section of the device, a top of the device 1704, and the sloped ring 1606 around the device, shown in FIG. 17B. The method further comprises etching (e.g., using a reactive-ion etch (RIE)), the doped material (e.g., polysilicon) on the top of the device and on the sloped ring 1606, shown in FIG. 18 (e.g., the polysilicon on the sloped ring and the top of the cylinder has been removed). The method further comprises depositing a siliciding metal to create the fourth conductive layer of low resistivity. In some implementations, the method further comprises performing rapid thermal anneal (RTA) to create the fourth conductive layer of low resistivity. In some implementations, the inside of the channel is also silicided (not shown).

In some implementations, the method further includes etching (e.g., wet etching) the unreacted siliciding metal after performing the RTA. In some implementations, the device is a cylindrical device and the plurality of layers are annular layers.

Figure 19A:
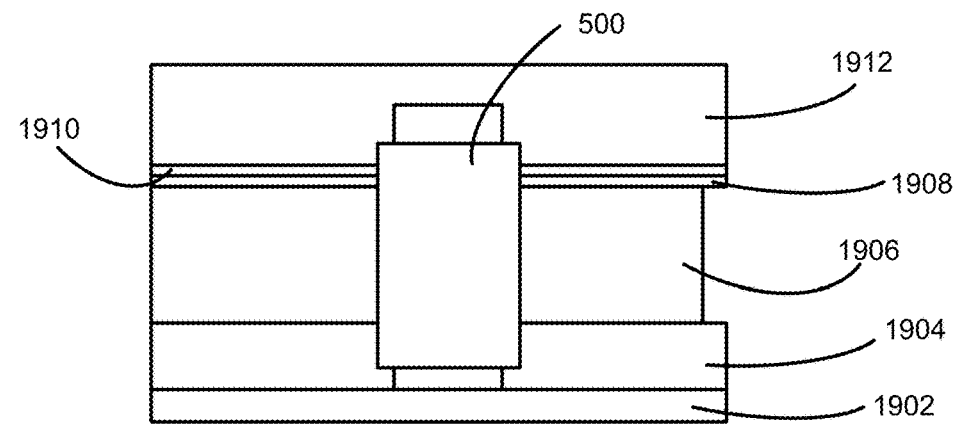
FIGS. 19A-19B illustrate a process for creating a gate handle for a transistor in accordance with some implementations.
Figure 19A:
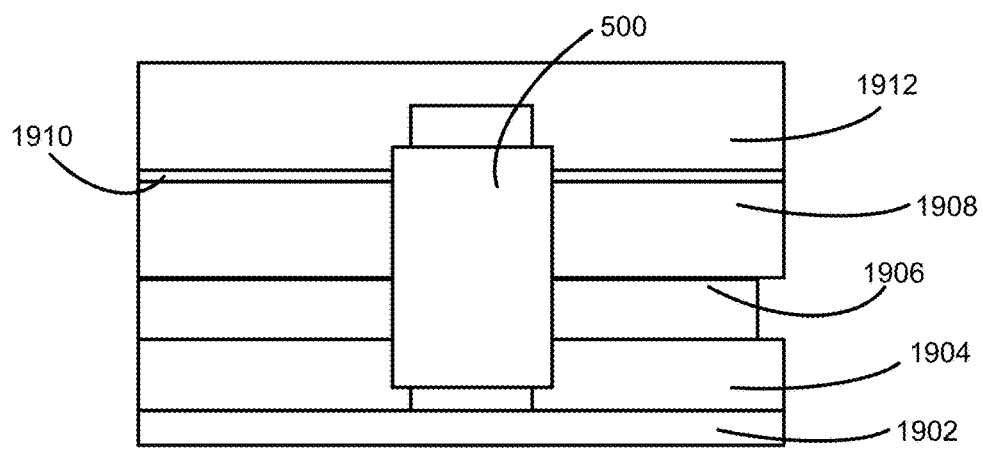
Figure 19A:
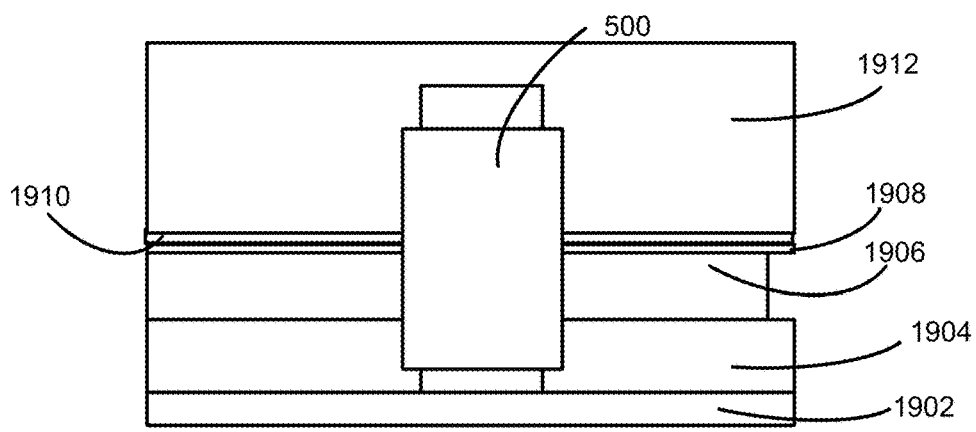
Figure 19B:
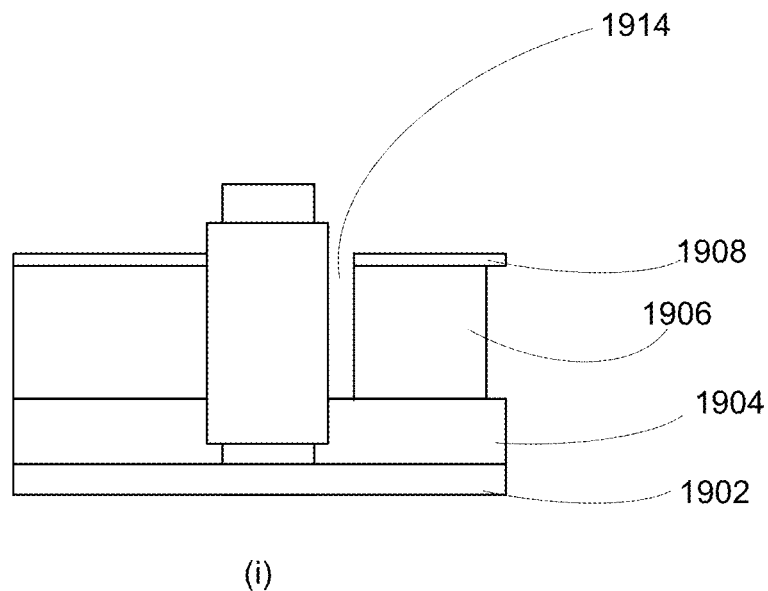
Figure 19B:
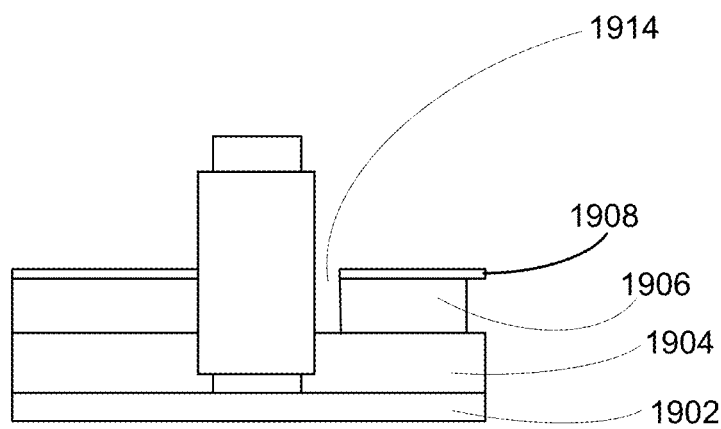

FIGS. 19A-19B illustrates a process for creating a gate handle for a transistor in accordance with some implementations. For example, a method is provided for creating a first (e.g., or second) transistor gate handle (e.g. second input terminal 514) of the two transistors. In some implementations, the method includes coupling a channel (e.g., the channel is also coupled to the drain/second layer of the device) of the cylindrical device to a silicide source (e.g., coupled at the bottom of the cylindrical device). For example, the channel is disposed between the drain and the source. In some implementations, the method of fabricating an annular device includes providing a device having two transistors. For example, providing a cylindrical device having a conductive core 502 corresponding to a first transistor and a plurality of annular layers surrounding the core 502, including a first dielectric layer 504, a second layer 506, a third dielectric layer 508, and a fourth conductive layer 510 corresponding to a second transistor, wherein the fourth conductive layer is an outermost layer of the cylindrical device.

The method further includes creating a gate handle, including depositing a first oxide layer to create a first oxide plane 1902. In some implementations, the first oxide layer is created by depositing a first low-temperature oxide (LTO) layer. The method further includes depositing a spin-on glass (SOG) layer 1904 on the first oxide plane 1902, wherein the device 500 is vertically disposed in the first oxide plane 1902. In some implementations, the method further includes etching (e.g., reactive-ion etching) the SOG layer 1904 to a first thickness.

The method further includes spin coating (e.g., depositing) an organic compound to a first height to create an organic planarizing layer (OPL) 1906, wherein the OPL 1906 surrounds a horizontal cross section of the cylindrical device 500. The method further includes depositing a second oxide (e.g., LTO) layer 1908 onto the OPL 1906 and depositing anti-reflective coating on the second oxide layer. In some implementations the second oxide (e.g., LTO) layer 1908 surrounds a horizontal cross section (e.g., above the horizontal cross section surrounded by the OPL 1906) of the cylindrical device 500. In some implementations, the method includes depositing (e.g., coating) the second LTO layer 1908 with a bottom anti-reflective coating (BARC) layer 1910 and coating the BARC layer 1910 with a photoresist layer 1912, wherein the BARC layer 1910 and the photoresist layer 1912 surround a horizontal cross section of the cylindrical device (e.g., above the horizontal cross sections of the device surrounded by the OPL layers and LTO layer).

FIG. 19A shows the device before masking and etching the OPL with varying thickness of the layers 1912, 1908, and 1906. The varied thickness of the layers enables contacts of varying dimensions to be coupled to the outer layer (e.g., the annular wrap-around poly silicide) of the device 500. For example, the thicknesses in example (i) enable a contact that spans most of the length of the device 500 (e.g., the contact 514 in FIG. 5). As another example, the thicknesses in example (iii) enable a contact configured to stack with other contacts in the vertical plane (e.g., the Gate 2 contact in FIG. 6). FIG. 19B shows the device after masking and etching the OPL (e.g., such that a long trench is formed for a gate handle for the second transistor to be filled in). The example (i) in FIG. 19B corresponds to example (i) in FIG. 19A and the example (ii) in FIG. 19B corresponds to the example (iii) in FIG. 19A.

The method includes removing, using a first removal technique the anti-reflective coating and the second oxide layer. For example, the method may further include creating a mask with the photoresist layer and dry etching the BARC layer and the second LTO layer using a fluorine-based chemistry (e.g., the first removal technique) through the BARC layer and the second LTO layer into the OPL (e.g., the top portion of the OPL without etching through the OPL completely), wherein the dry etching is defined by the mask of the photoresistive layer. The method further includes removing, using a second removal technique (e.g., which may be the same or different than the first removal technique), the OPL (e.g., etching in oxygen plasma) until the SOG layer 1904 is exposed to create a trench 1914. The method further includes depositing tantalum nitride (e.g., or other conductive material) in the trench 1914 to create a gate (e.g., second input terminal 514) that extends outwardly from the fourth conductive layer.

In some implementations, the photoresistive layer and the BARC layers are completely etched off. In some implementations, the silicide source is coupled to the channel (e.g., which is also coupled to the drain/second layer) and is not coupled to the remaining plurality of annular layers (e.g., the silicide source is only coupled to the channel drain without being coupled to the remaining plurality of layers). For example, the silicide source is selectively coupled to prevent a shorting (e.g., of the circuit) of the device.

Figure 20A:
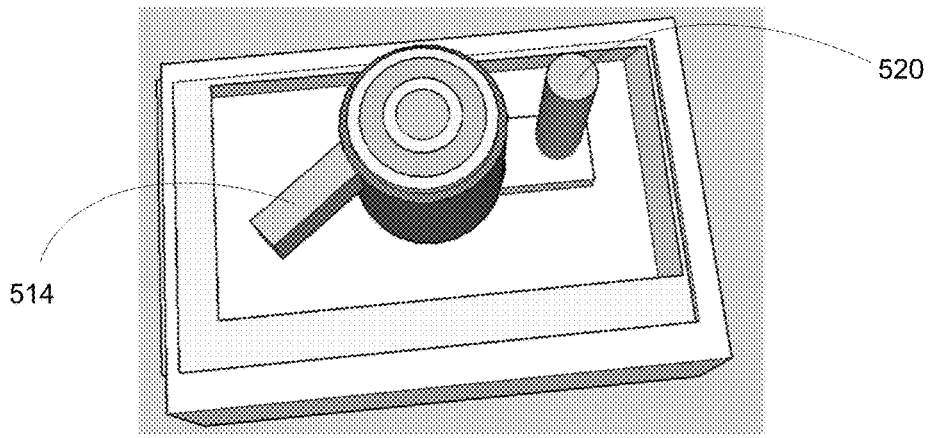
FIGS. 20A-20D illustrate a device having a source and an annular transistor in accordance with some implementations.
Figure 20B:
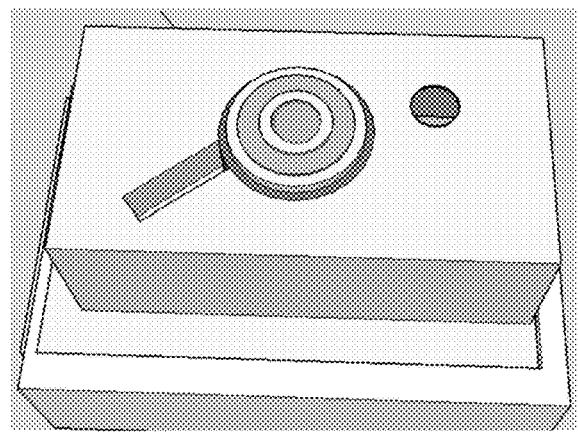
Figure 20C:
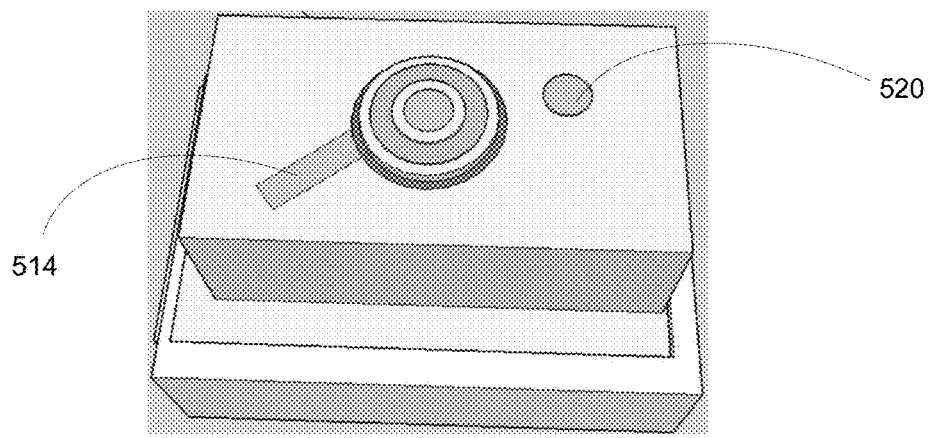
Figure 20D:
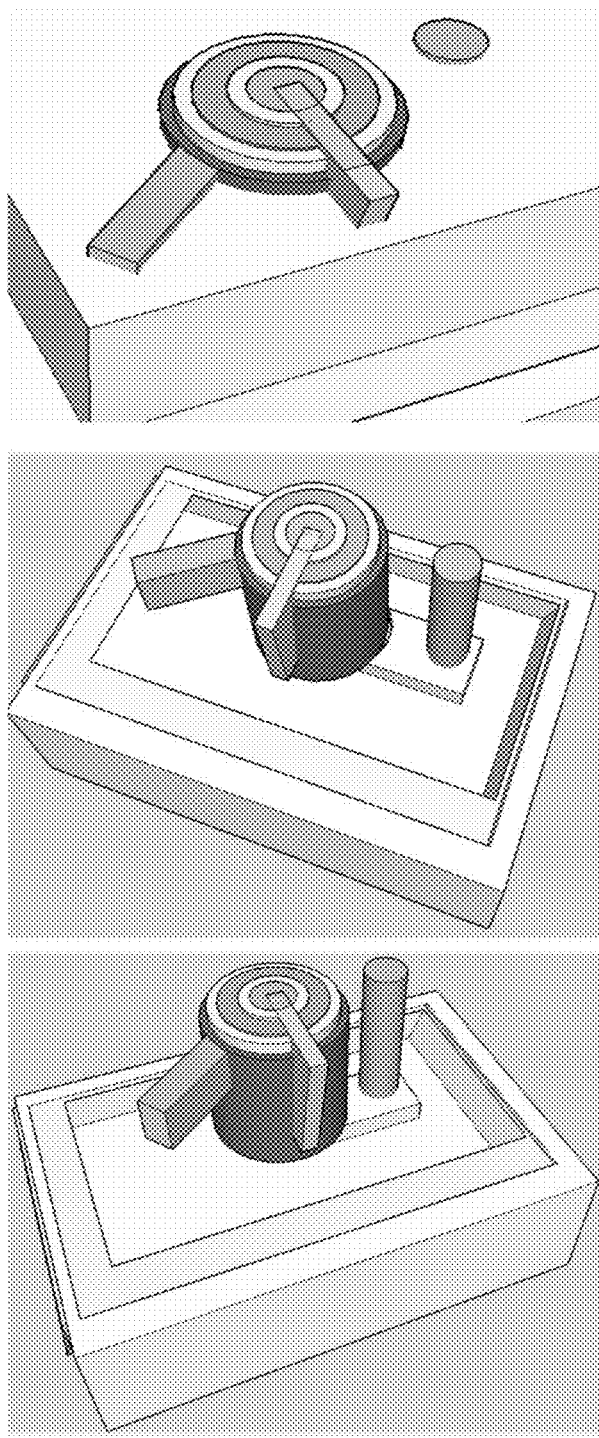

FIGS. 20A-20D illustrates a schematic of the device having a contact (e.g., a gate handle contact) to an annular transistor. FIG. 20A illustrates the device after repeatedly depositing and etching to fill in the second input terminal (e.g., by filling trench 1914 with TaN) and the source contact 520. Then, a CMP of the TaN may be performed. Next, the process may include etching LTO layer and performing an oxygen plasma ash off the OPL. FIG. 20B illustrates the device after the contacts have been etched. In some implementations, two masks or a single combined mask may be used to etch the contacts. FIG. 20C illustrates depositing and etching repeatedly to fill in the handle to the fourth layer (e.g., contacting the fourth layer with the second input terminal 514) and to fully fill in the source contact 520. FIG. 20D illustrates various schematics of the device with and without SOG and LTO layers. The TaN may be recessed, as shown as the bottom image of FIG. 20D, by selective wet or dry etching followed by filling the recessed areas with silicon oxide (SiO2) and CMP.

FIGS. 20A-20D also show a contact to the conductive core (e.g., in addition to the gate handle contact to the annular transistor described above). A method for creating a contact to the first transistor (e.g., the conductive core 502) may include depositing (e.g., by chemical vapor deposition (CVD)), a first silicon nitride (SiN) layer to create a first SiN plane. The method for further comprises depositing a spin-on glass (SOG) layer and an oxide (e.g., a low temperature oxide (LTO)) layer on the first SiN plane. In some implementations, the method further includes performing a metal gate contact mask to define the contact to the first transistor. The method further includes etching (e.g., using an ion beam trench etch), to create a trench at a required depth through the plurality of layers. The method further includes depositing a second SiN layer in the trench 2102 and on sides of the trench and removing, at least partially, the deposited first SiN layer from the core. In some implementations, the removal is performed by a first chemical mechanical polishing (CMP). The method further includes depositing a metal gate contact to create the contact to the first transistor (e.g., conductive core). For example, this method makes the bottom of the trench an insulating layer of Silicon Nitride, which prevents the shorting of underneath various metal layers. In some implementations, the metal gate contact is composed of Tantalum Nitride (TaN). In some implementations, the metal gate contact material (e.g., TaN) is deposited over the plurality of layers.

Figure 20E:
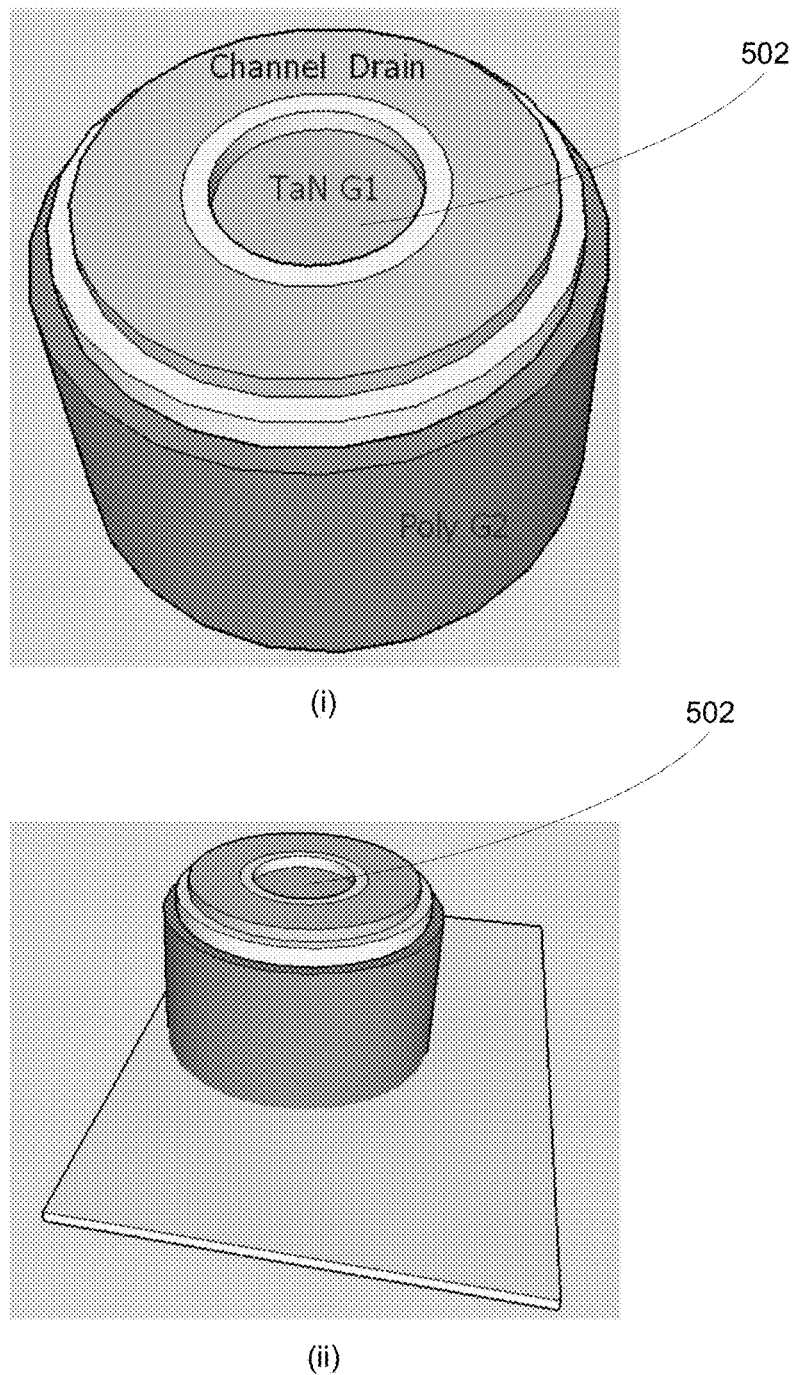
FIGS. 20E-20G illustrate a representative process of planarizing a representative device in accordance with some implementations.
Figure 20F:
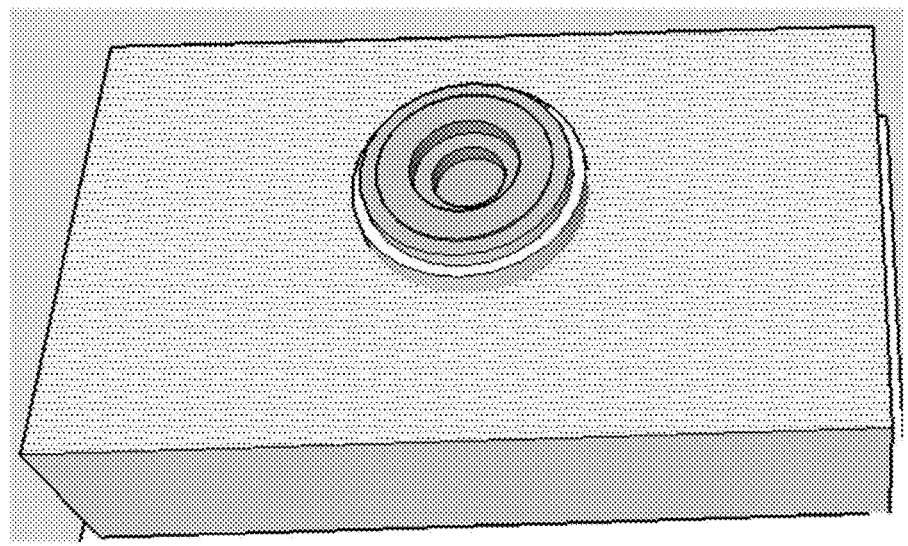
Figure 20G:
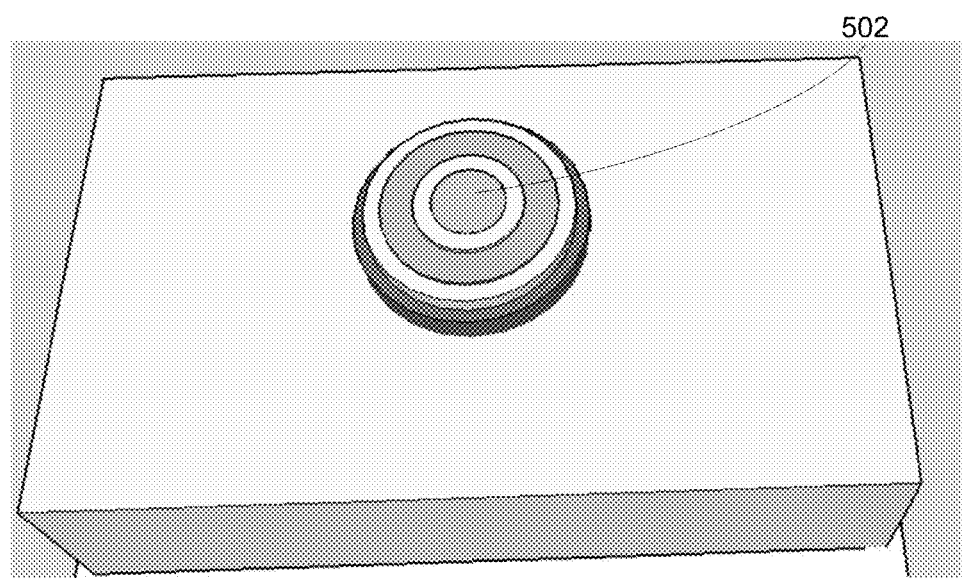
Figure 20H:
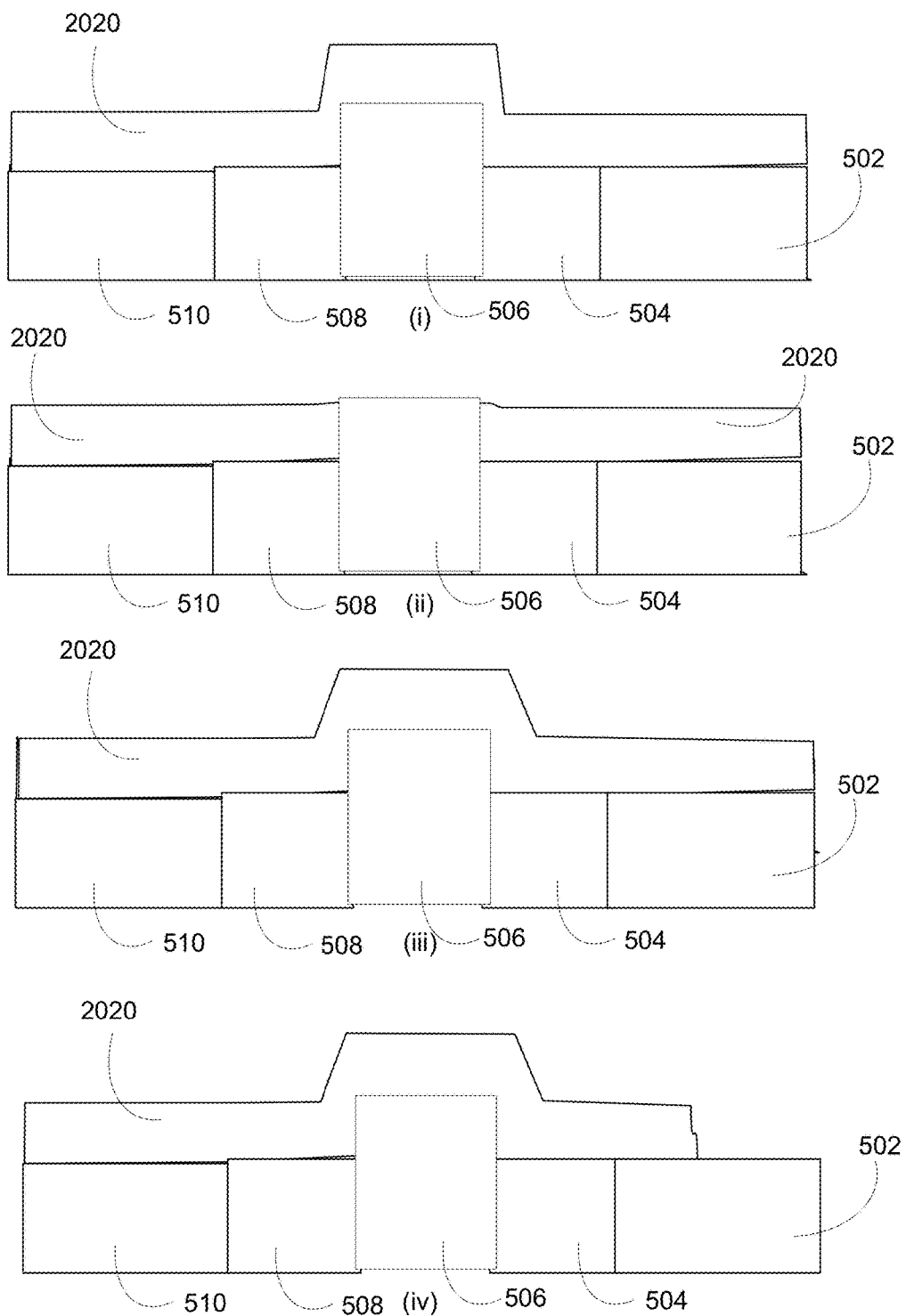
FIGS. 20H-20K illustrate a representative process for adjusting heights of a representative device in accordance with some implementations.

FIGS. 20E-20G illustrate a device with given heights and planarizing the device. As shown in FIG. 20E, the core (e.g., TaN G1) is lower than the channel drain (e.g., the second layer). In some implementations, the channel drain has the greatest height. FIG. 20F depicts how to planarize various electrodes by depositing TaN Gate 1 electrode over the surface of the device and plane, followed by performing a CMP of the TaN, as shown in FIG. 20G.

FIGS. 20H-20K illustrate a process for adjusting heights of a device. In some implementations, the drain (e.g., second layer 506) is higher in the device than the core 502 and the plurality of other layers, including layer 504, 508 and 510. SiN 2020 is deposited over the layers and core. Then, a CMP is performed on the SiN to expose the drain 506, such that a metal contact may be deposited onto the drain, as shown in the top two figures of FIG. 20H. Thus, a contact to the drain when the drain is the highest layer is possible. In order to contact the core 502 (e.g., which is lower in height than the drain), a layer of SiN 2022 is deposited over the layers and core. Then, a mask is applied to open the contact to the core 502 (e.g., the gate of the first transistor) and a metal damascene is applied.

Figure 20I:
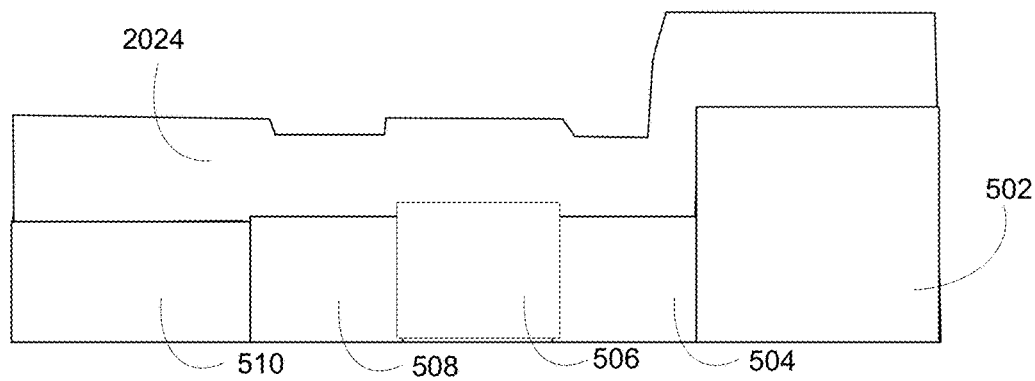
Figure 20J:
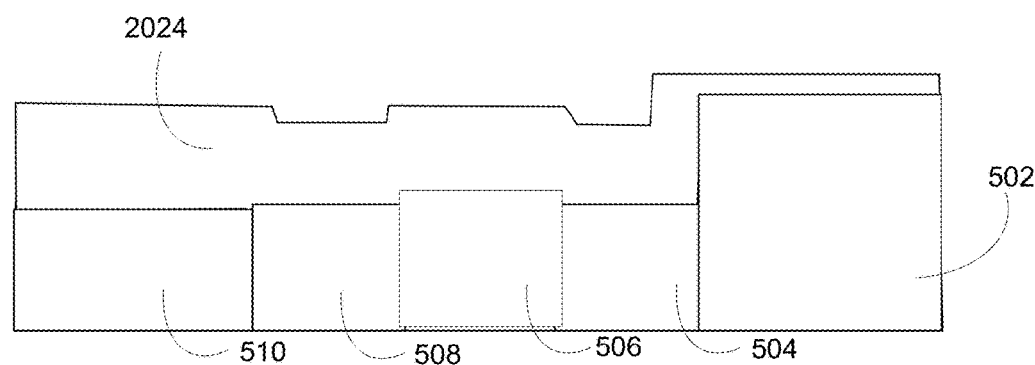
Figure 20K:
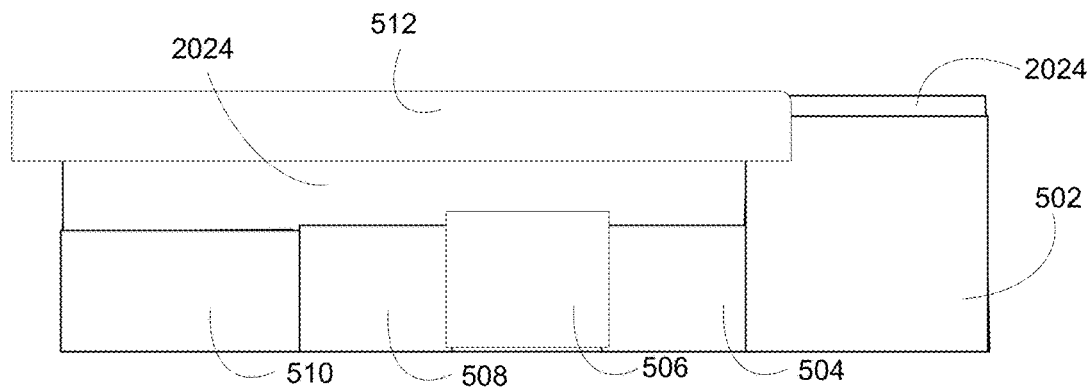
Figure 21A:
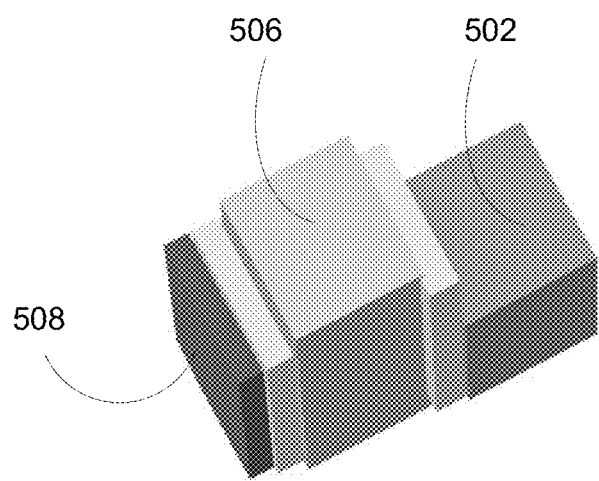
FIGS. 21A-21G illustrate a planarization process for an annular device in accordance with some implementations.
Figure 21B:
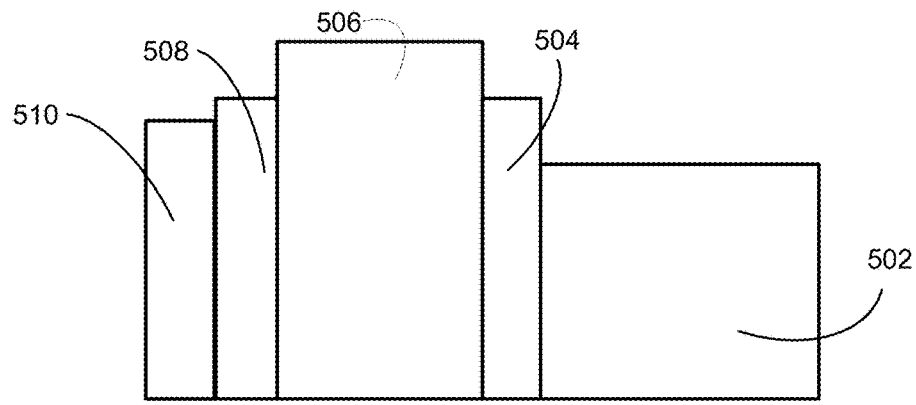
Figure 21C:
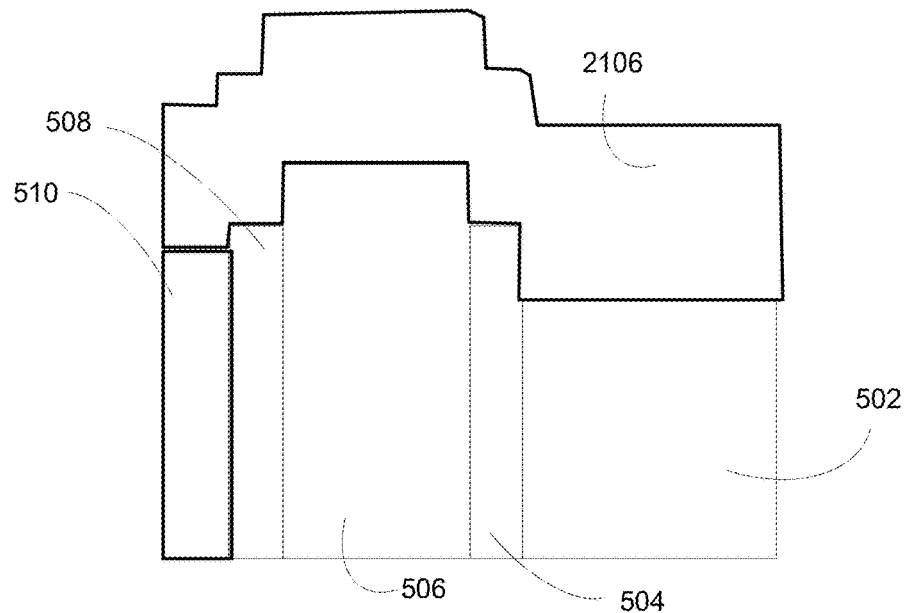
Figure 21D:
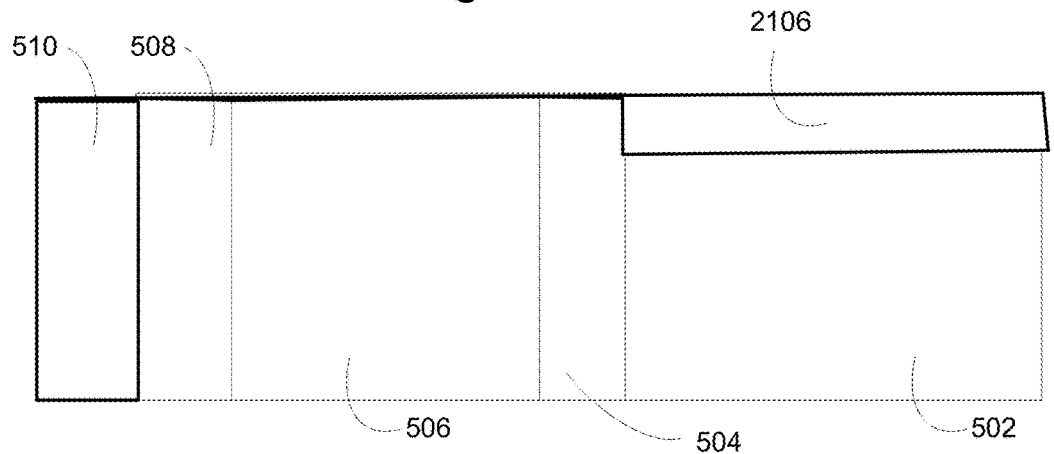
Figure 21E:
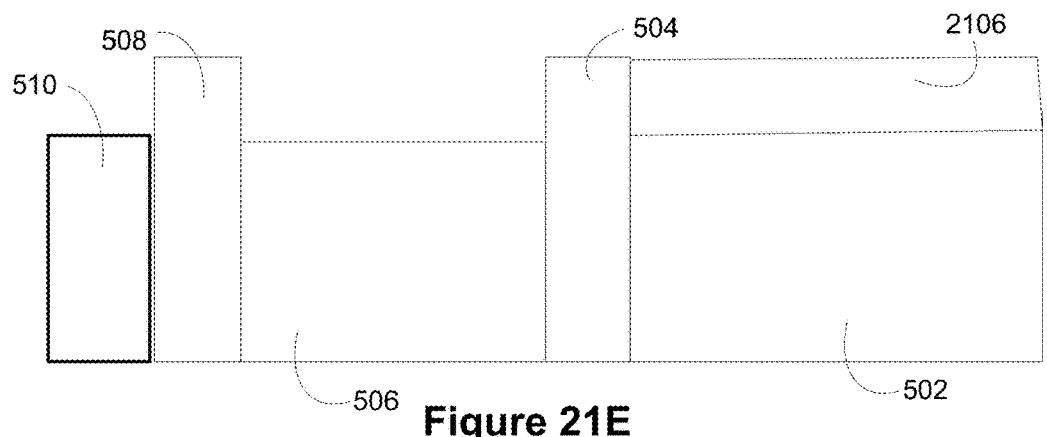
Figure 21F:
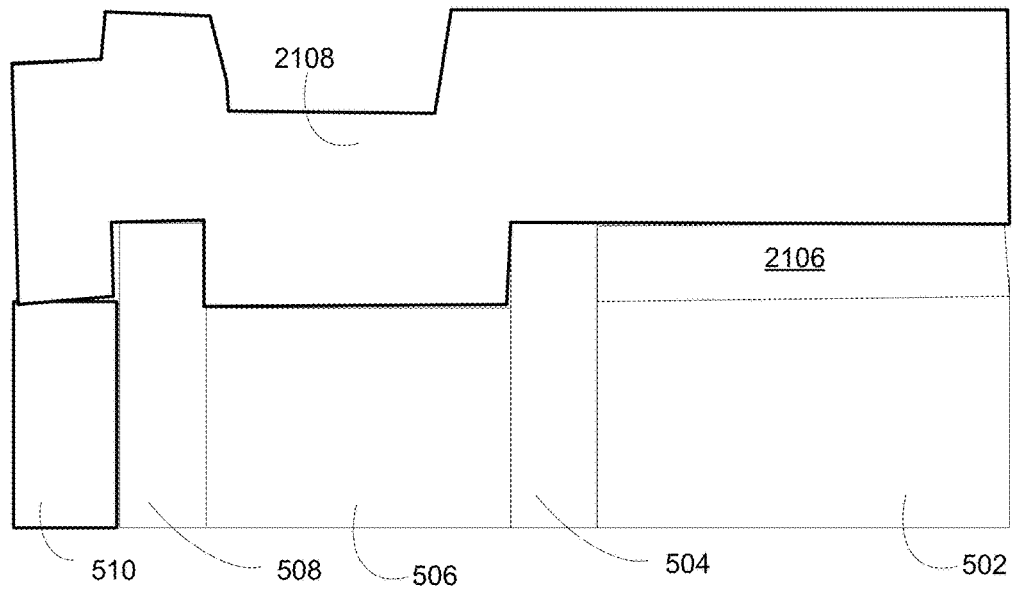
Figure 21G:
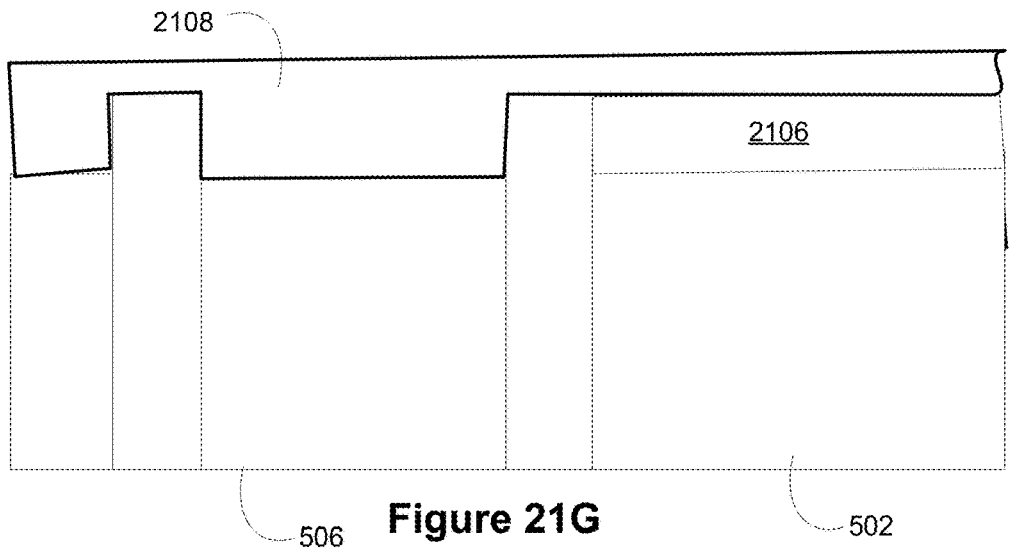

FIGS. 20I-20K illustrate a process of contacting the core when the core 502 is the tallest height of the device. A layer of SiN 2024 is deposited. Then, a CMP is performed on the SiN 2024 to reduce its height on core 502, as shown in FIG. 20J. Next, masking and etching a trench handle is performed. The trench is then filled in with metal and a CMP is performed to create first input terminal 512.

Figure 22A:
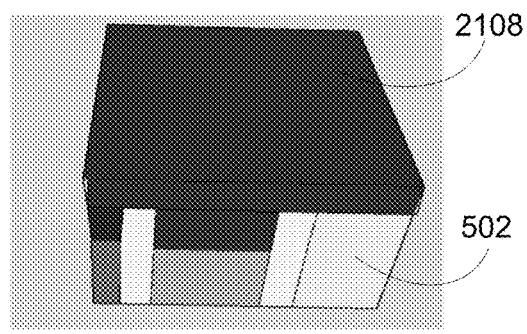
FIGS. 22A-22C illustrate a process for etching an annular device in accordance with some implementations.
Figure 22B:
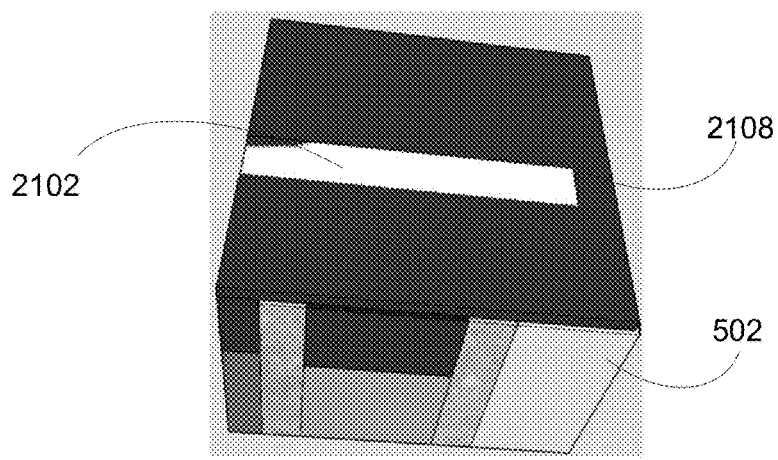
Figure 22C:
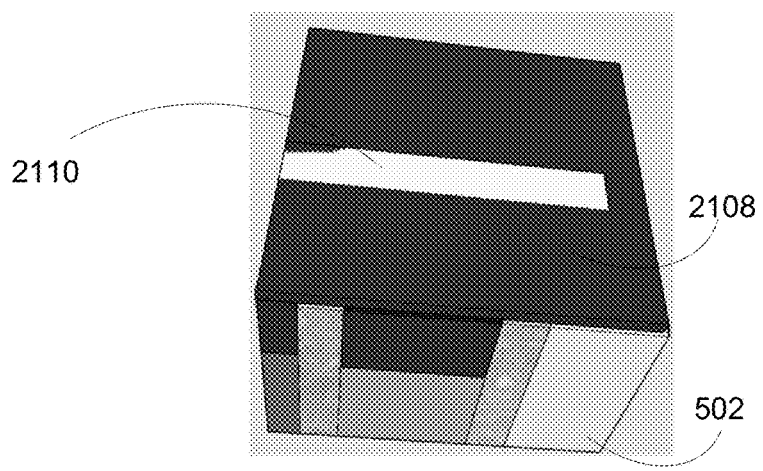
Figure 23A:
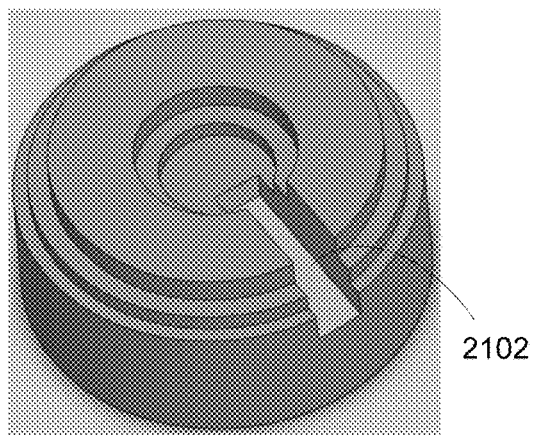
FIGS. 23A-23C illustrate a process for contacting a layer of an annular device in accordance with some implementations.
Figure 23B:
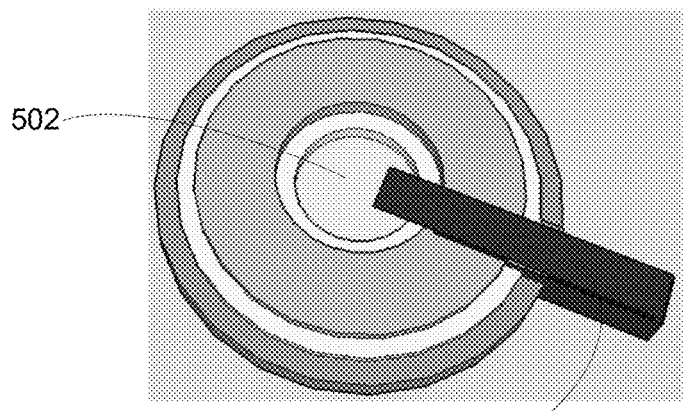
Figure 23C:
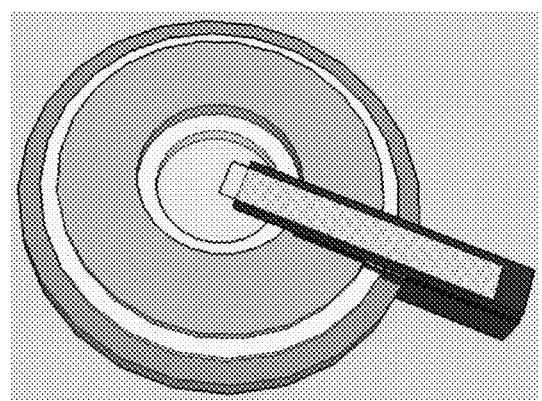

FIGS. 21-23 illustrate a process for contacting (e.g., creating a first input terminal) a transistor located in the center of a device in accordance with some implementations. FIG. 21A is a cross-sectional view of the plurality of layers surrounding the core 502. In some implementations, the core 502 (e.g., the first transistor gate) is the lowest in height of the layers of the device. FIGS. 21B-21G illustrate another cross-sectional view of the device. As shown in FIG. 21C, a layer of metal gate material (e.g., TaN 2106) is deposited. Then, a CMP of the TaN is performed to the second highest layer (e.g., the fourth layer 510 is the second highest in this example), as shown in FIG. 21D. Next, mask with a first mask handle for the first gate (e.g., mask for the first input terminal 512), perform a wet dip in potassium hydroxide and Tetra Methyal Ammonium Hydroxide (TMAH) SOL to lower the heights of silicon and polysilicon in the first handle area (e.g., where the first input terminal 512 will be) only. TMAH is an etchant that etches Silicon and polysilicon without etching the oxide layer(s). Then, deposit thick SiN 2108, as shown in FIG. 21F. Perform a CMP on the SiN 2108 to leave the SiN 2108 to a 200A thickness on a TaN pad over core 502, as shown in FIG. 21G.

In some implementations, a method of forming a contact (e.g., first input terminal and/or second input terminal and/or drain terminal) comprises, at a device (e.g., an annular device) composed of a core and a plurality of layers that surround the core in succession, the plurality of layers including a first layer and a second layer, wherein the core and the second layer are separated by the first layer, depositing a coating on a surface of the annular device, the surface including the core and the plurality of layers. The method further comprises determining relative heights of the core, the first layer, and the second layer. In accordance with a determination that the second layer has the largest relative height, the method comprises performing a first removal of the coating to expose the second layer, depositing a first metal on the second layer, performing a second removal of the coating to expose the core, and depositing a second metal on the core. In accordance with a determination that the core has the largest relative height, the method comprises etching a portion of the coating to expose the core and forming a first terminal by depositing a conductive material, wherein the conductive material contacts the exposed core and the first input terminal extends radially outward from the annular device.

In some implementations, the method further comprises, after forming the first input terminal, planarizing a top surface of the first input terminal to create a flat surface. In some implementations, the first removal is a planarization (e.g., polishing) process. In some implementations, the first removal is a chemical mechanical planarization process. In some implementations, the coating is a nitride-based coating. In some implementations, the plurality of layers further includes a third layer and a fourth layer. In some implementations, the core, the first layer, and the second layer correspond to a first transistor, the second layer, the third layer, and the fourth layer correspond to a second transistor, and the second layer is a channel drain common to the first transistor and the second transistor. In some implementations, the first metal is the second metal.

FIG. 22 illustrates three-dimensional views of creating the contact with core 502. FIG. 22A is a three-dimensional view of the device after the CMP of SiN 2108 before performing a second mask handle for the first gate (e.g., first input terminal 512). FIG. 22B is a three-dimensional view after performing the second masking and etching of SiN down to the metal of the first gate of the first transistor, as shown by the open trench 2102. FIG. 22C illustrates a three-dimensional view of the handle after depositing and performing a CMP of metal 2110 to create the first input terminal 512 coupled with core 502.

In some implementations, the method of creating a contact with the core, as shown in FIG. 22, comprises providing a device having two transistors, where the device comprises (i) a conductive core corresponding to a first transistor of the two transistors and (ii) a plurality of layers surrounding the core. In some implementations, a cylindrical device having a conductive core 502 corresponding to a first transistor and a plurality of annular layers surrounding the core, including a first dielectric layer 504, a second layer 506, a third dielectric layer 508, and a fourth conductive layer 510 corresponding to a second transistor is provided. In some implementations, the core 502 (e.g., Gate 1) is the lowest in height (e.g., shortest), as shown in FIG. 23A.

In some implementations, handle 2110 has various thicknesses as it crosses the cross-sections of the plurality of layers. For example, the handle 2110 shown in FIG. 22C may be narrower at the core 502 and may increase in thickness outwardly (e.g., through the plurality of layers).

FIG. 24 is a diagram of an array 2400 of dual threshold voltage devices in accordance with some implementations. The array 2400 includes a plurality of dual threshold voltage devices shown in example (i) (e.g., the device 600, FIG. 6). In the array 2400 the contact handle to the gate 1 of the first transistor and the contact handle to gate 2 of the second transistor are vertically aligned. A vertically-aligned configuration is desirable as it enables a higher density layout as shown in FIG. 24 (e.g., for higher density MRAM and other memory devices layout). In some implementations, the layout size is determined by a minimum size of the core (e.g., the core 502) and minimum size of the drain. In some implementations, the unit cell size of a device is greater than 25F^2, where F represents a unit size (e.g., based on the fabrication process). The wordline 2406 couples to the Gate 1 contact and the wordline 2408 couples to the Gate 2 contact in accordance with some implementations. The wordline 2406 couples to the Gate 1 contact of each device in the first row and the wordline 2408 couples to the Gate 2 contact of each device in the first row in accordance with some implementations. As shown in FIG. 24(i), the wordline 2406 and the wordline 2408 optionally overlap by stacking gate 1 and gate 2 vertically (e.g., without bridging them together) in accordance with some implementations. The source line 2402 couples to a source contact (e.g., the source contact 520, FIG. 5, or the source contact 618, FIG. 6) of each device in a column of devices, and the drain line 2402 couples to a drain contact (e.g., the drain contact 616, FIG. 6) of each device in the column of devices. Thus, in some implementations, the devices are arranged with a 4F pitch as shown in FIG. 24.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first device could be termed a second device, and, similarly, a second device could be termed a first device, without departing from the scope of the various described implementations. The first device and the second device are both electronic devices, but they are not the same device unless it is explicitly stated otherwise.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A method of fabricating a cylindrical device, comprising:
providing a cylindrical device having two transistors sharing a common silicide source; and
creating the silicide source, including:
depositing multiple layers in succession on an oxidized silicon substrate, the multiple layers including at least an oxide layer and a planarization layer;
removing, at least partially, the oxide layer and the planarization layer until the silicon substrate is exposed;
removing, at least partially, the oxide layer to expose a horizontal cross section of the cylindrical device to create an annular silicon substrate area; and
after the removing, depositing a siliciding metal on the annular area to form the silicide source.

2. The method of claim 1, further comprising:
before depositing the siliciding metal and after a source ion implant operation and removing a photoresist, performing a first rapid thermal annealing (RTA); and
after depositing the siliciding metal, performing a second RTA.

3. The method of claim 1, wherein the annular area is at a bottom of the cylindrical device.

4. The method of claim 1, wherein providing the cylindrical device having the two transistors comprises: (i) providing a conductive core corresponding to a first transistor of the two transistors, and (ii) forming a plurality of cylindrical layers around the conductive core, including a first dielectric layer, a second layer, a third dielectric layer, and a fourth conductive layer corresponding to a second transistor of the two transistors.

5. The method of claim 3, wherein the second layer of the cylindrical device corresponds to a common channel of two transistors in parallel, and the common channel composed of semiconductor material.

6. The method of claim 5, further comprising removing the siliciding metal from the second layer of the cylindrical device, wherein removing the siliciding metal leaves a residual reacted metal forming the silicide source.

7. The method of claim 4, further comprising applying a mask after depositing the multiple layers and after removing some selectively, wherein the mask protects covered areas.

8. The method of claim 4, wherein forming the plurality of cylindrical layers around the cylindrical core comprises:
depositing a spin-on glass (SOG) layer on a first plane of the cylindrical device to create a sloped ring around the bottom of the cylindrical device, wherein the cylindrical device is vertically disposed in the first plane and the SOG layer surrounds the cylindrical device;
etching the SOG layer from around and inside the cylindrical device to a desired depth;
depositing one or more dielectric materials to form the third dielectric layer;
depositing a doped material on the first plane, a horizontal cross section of the cylindrical device, a top of the cylindrical device, and the sloped ring;
etching the doped material on the top of the cylindrical device and on the sloped ring; and
depositing a siliciding metal to create the fourth conductive layer.

9. The method of claim 8, further comprising performing a third RTA to finish creation of the fourth conductive layer.

10. The method of claim 9, further comprising wet etching the unreacted siliciding metal after the third RTA.

11. The method of claim 4, wherein:
the oxide layer is a first oxide layer; and
the method further comprises creating a contact to the second transistor of the two transistors, including:
depositing a second oxide layer to create an oxide plane;
depositing a spin-on glass (SOG) layer on the oxide plane, wherein the cylindrical device is vertically disposed in the oxide plane;
depositing an organic compound to a first height to create an organic planarization layer (OPL), wherein the OPL surrounds a horizontal cross section of the cylindrical device;
depositing a third oxide layer onto the OPL, wherein the third oxide layer surrounds a horizontal cross section of the cylindrical device;
depositing anti-reflective coating and photoresist on the third oxide layer;
removing, using a first removal technique, the anti-reflective coating and the third oxide layer,
removing, using a second removal technique, the OPL until the SOG layer is exposed, thereby forming a trench; and
depositing a metallic material in the trench to create the contact to a gate of the second transistor.

12. The method of claim 11, further comprising etching the SOG layer to a first thickness before depositing the organic compound.

13. The method of claim 11, wherein the first removal technique is a fluorine-based chemistry.

14. The method of claim 13, further comprising depositing a photoresist layer on the anti-reflective coating, wherein the anti-reflective coating and the photoresist layer surround a horizontal cross section of the cylindrical device.

15. The method of claim 14, further comprising creating a mask with the photoresist layer before removing the anti-reflective coating and the second oxide layer using the fluorine-based chemistry, wherein said removing is defined by the mask of the photoresist layer.

16. The method of claim 11, wherein the second removal technique uses oxygen plasma to remove the OPL.

17. The method of claim 11, wherein the metallic material is tantalum nitride.

18. The method of claim 4, wherein the method further comprises creating a contact to the first transistor of the two transistors, including:
depositing, on top of the plurality of cylindrical layers, a metal gate contact material;

etching through the plurality of cylindrical layers and the metal gate contact material to a first height extending across the conductive core through the fourth layer;

depositing, a first mask;

depositing a layer of silicon nitride (SiN);

depositing a second mask and etching the layer of SiN in accordance with the second mask to create a flat surface; and depositing a metal gate contact on the flat surface to create a contact to the first transistor.

19. The method of claim 18, wherein the metal gate contact material is tantalum nitride.

20. The method of claim 18, wherein the first height is based on the height of a second highest layer of the plurality of layers.

21. The method of claim 18, further comprising, after depositing the first mask, wet dipping the plurality of layers in potassium hydroxide in accordance with the mask.

22. The method of claim 21, wherein the wet dipping decreases the height of the third layer and the fourth layer.

23. The method of claim 18, wherein the layer of silicon nitride is thick SiN.

24. The method of claim 18, further comprising, performing a chemical mechanical polishing (CMP) on the layer of SiN.

25. The method of claim 1, wherein the two transistors have dual threshold voltages.

* * * * *

UNITED STATES PATENT AND TRADEMARK OFFICE
CERTIFICATE OF CORRECTION

PATENT NO. : 10,192,789 B1  
APPLICATION NO. : 15/865140  
DATED : January 29, 2019  
INVENTOR(S) : Sharma et al.

Page 1 of 1

It is certified that error appears in the above-identified patent and that said Letters Patent is hereby corrected as shown below:

In the Claims

Claim 5, Column 25, Line 52, please delete "claim 3," and insert --claim 4,--;

Claim 5, Column 25, Line 54, please delete "channel composed" and insert --channel is composed--;

Claim 8, Column 25, Line 64, please delete "the cylindrical core" and insert --the conductive core--;

Claim 8, Column 25, Line 66, please delete "around the" and insert --around a--;

Claim 18, Column 27, Line 10, please delete "a contact" and insert --the contact--.

Signed and Sealed this  
Twenty-first Day of May, 2019

Andrei Iancu  
*Director of the United States Patent and Trademark Office*